US008551877B2

(12) United States Patent
Ranjan et al.

(10) Patent No.: US 8,551,877 B2
(45) Date of Patent: Oct. 8, 2013

(54) SIDEWALL AND CHAMFER PROTECTION DURING HARD MASK REMOVAL FOR INTERCONNECT PATTERNING

(75) Inventors: Alok Ranjan, Slingerlands, NY (US); Kaushik Arun Kumar, Poughkeepsie, NY (US)

(73) Assignee: Tokyo Electron Limited, Tokyo (JP)

( * ) Notice: Subject to any disclaimer, the term of this patent is extended or adjusted under 35 U.S.C. 154(b) by 59 days.

(21) Appl. No.: 13/414,015

(22) Filed: Mar. 7, 2012

(65) Prior Publication Data

US 2013/0236989 A1 Sep. 12, 2013

(51) Int. Cl.
*H01L 21/4763* (2006.01)
*H01L 23/532* (2006.01)

(52) U.S. Cl.
USPC ........... 438/622; 438/623; 438/624; 257/758; 257/759; 257/760; 257/E21.507

(58) Field of Classification Search
USPC ................ 438/622, 623, 624; 257/758, 759, 257/760, E21.507
See application file for complete search history.

(56) References Cited

U.S. PATENT DOCUMENTS

| | | | | |
|---|---|---|---|---|
| 5,304,510 A * | 4/1994 | Suguro et al. | ................ | 438/624 |
| 5,552,344 A * | 9/1996 | Jang et al. | ..................... | 438/624 |
| 5,618,379 A * | 4/1997 | Armacost et al. | ............. | 438/595 |
| 5,661,093 A * | 8/1997 | Ravi et al. | ..................... | 438/763 |
| 6,149,779 A * | 11/2000 | Van Cleemput | ......... | 204/192.37 |
| 6,150,234 A * | 11/2000 | Olsen | ........................... | 438/424 |
| 6,207,544 B1 | 3/2001 | Nguyen et al. | | |
| 6,242,334 B1 | 6/2001 | Huang et al. | | |
| 6,261,913 B1 | 7/2001 | Akram et al. | | |
| 6,271,153 B1 * | 8/2001 | Moore | ......................... | 438/787 |
| 6,277,700 B1 | 8/2001 | Yu et al. | | |
| 6,333,547 B1 * | 12/2001 | Tanaka et al. | ................. | 257/649 |
| 6,391,738 B2 * | 5/2002 | Moore | ......................... | 438/402 |
| 6,475,929 B1 * | 11/2002 | Gabriel et al. | ................. | 438/783 |
| 6,531,390 B2 * | 3/2003 | Chooi et al. | .................. | 438/637 |
| 6,547,977 B1 * | 4/2003 | Yan et al. | ........................ | 216/72 |
| 6,731,006 B1 * | 5/2004 | Halliyal et al. | ............... | 257/758 |
| 6,756,313 B2 | 6/2004 | Choi et al. | | |
| 6,767,825 B1 * | 7/2004 | Wu | ............................... | 438/633 |
| 6,790,723 B2 * | 9/2004 | Tanaka et al. | ................. | 438/243 |
| 6,812,133 B2 * | 11/2004 | Takeuchi | ...................... | 438/623 |
| 6,838,392 B1 * | 1/2005 | Ramkumar | .................... | 438/745 |
| 6,972,253 B2 * | 12/2005 | Liu et al. | ........................ | 438/627 |
| 7,005,390 B2 * | 2/2006 | RamachandraRao et al. | ............................ | 438/778 |

(Continued)

OTHER PUBLICATIONS (Abstract Only) Martin Kogelschatz, Gilles Gunge, and Nader Sadeghi. Analysis of the chemical composition and deposition mechanism of the SiOx-Cly layer on the plasma chamber walls during silicon gate etching. J.Vac.Sci. Technol. A 22, 624 (2004).

*Primary Examiner* — Mary Wilczewski

(57) ABSTRACT

A method for method for removing a hard mask is described. The method includes forming at least a portion of a trench-via structure in a low-k insulation layer on a substrate using one or more etching processes and a hard mask layer overlying the low-k insulation layer. Thereafter, the method includes depositing a SiOCl-containing layer on exposed surfaces of the trench-via structure to form an insulation protection layer, performing one or more etching processes to anisotropically remove at least a portion of the SiOCl-containing layer from at least one surface on the trench-via structure, and removing the hard mask layer using a mask removal etching process.

20 Claims, 23 Drawing Sheets

(56) References Cited

U.S. PATENT DOCUMENTS

| | | | |
|---|---|---|---|
| 7,060,555 B2* | 6/2006 | Tanaka et al. | 438/244 |
| 7,098,115 B2* | 8/2006 | Tanaka et al. | 438/424 |
| 7,192,881 B2 | 3/2007 | Kammler et al. | |
| 7,265,015 B2* | 9/2007 | Dong et al. | 438/257 |
| 7,285,853 B2* | 10/2007 | Liu | 257/734 |
| 7,342,290 B2 | 3/2008 | Burnham et al. | |
| 7,393,788 B2 | 7/2008 | Cook | |
| 7,553,769 B2 | 6/2009 | Toma et al. | |
| 7,592,249 B2* | 9/2009 | Maekawa | 438/623 |
| 7,723,237 B2 | 5/2010 | Hyland et al. | |
| 7,741,224 B2 | 6/2010 | Jiang et al. | |
| 7,795,148 B2 | 9/2010 | Brown | |
| 7,892,968 B2* | 2/2011 | Chen et al. | 438/639 |
| 7,955,979 B2* | 6/2011 | Kostamo et al. | 438/685 |
| 7,989,955 B2* | 8/2011 | Yagi | 257/758 |
| 8,030,779 B2* | 10/2011 | Park | 257/773 |
| 8,357,610 B2* | 1/2013 | Feustel et al. | 438/637 |
| 8,383,517 B2* | 2/2013 | Nishimura et al. | 438/700 |
| 2001/0004543 A1* | 6/2001 | Moore | 438/402 |
| 2003/0049571 A1 | 3/2003 | Hallock | |
| 2006/0024953 A1* | 2/2006 | Papa Rao et al. | 438/629 |
| 2006/0024954 A1* | 2/2006 | Wu et al. | 438/629 |
| 2006/0081986 A1* | 4/2006 | Clevenger et al. | 257/751 |
| 2006/0115981 A1 | 6/2006 | Shieh | |
| 2006/0121724 A1* | 6/2006 | Yue et al. | 438/625 |
| 2006/0148269 A1 | 7/2006 | Powell | |
| 2006/0183346 A1* | 8/2006 | Liu | 438/778 |
| 2007/0004136 A1* | 1/2007 | Dong et al. | 438/257 |
| 2007/0128800 A1* | 6/2007 | Dong et al. | 438/257 |
| 2007/0205482 A1* | 9/2007 | Yang et al. | 257/499 |
| 2007/0218679 A1* | 9/2007 | Schneider et al. | 438/638 |
| 2009/0085170 A1* | 4/2009 | Imada et al. | 257/629 |
| 2009/0146296 A1 | 6/2009 | Ye et al. | |
| 2009/0281344 A1* | 11/2009 | Wang et al. | 556/410 |
| 2010/0062592 A1 | 3/2010 | Clark | |
| 2010/0164057 A1* | 7/2010 | Hunks et al. | 257/520 |
| 2011/0287577 A1 | 11/2011 | Stewart et al. | |
| 2012/0098088 A1* | 4/2012 | Chen et al. | 257/510 |

* cited by examiner

SIDEWALL AND CHAMFER PROTECTION DURING HARD MASK REMOVAL FOR INTERCONNECT PATTERNING

FIELD OF INVENTION

The invention relates to a method of mitigating damage to a low dielectric constant (low-k) material.

BACKGROUND OF THE INVENTION

The practical implementation of low-k materials in insulation layer stacks for metal interconnects faces formidable challenges. Ultimately, it is desirable to integrate low-k dielectric materials in metal interconnects that achieve the full benefit of the reduced dielectric constant, while producing a structurally robust, patterned insulation layer with minimal damage. As low-k damage accumulates, it manifests in metal interconnects with inferior performance and poor reliability.

SUMMARY OF THE INVENTION

Embodiments of the invention relate to a method of mitigating damage to a low dielectric constant (low-k) material.

According to one embodiment, a method for method for removing a hard mask is described. The method includes forming at least a portion of a trench-via structure in a low-k insulation layer on a substrate using one or more etching processes and a hard mask layer overlying the low-k insulation layer. Thereafter, the method includes depositing a SiOCl-containing layer on exposed surfaces of the trench-via structure to form an insulation protection layer, performing one or more etching processes to anisotropically remove at least a portion of the SiOCl-containing layer from at least one surface on the trench-via structure, and removing the hard mask layer using a mask removal etching process.

According to another embodiment, a method of patterning a low-k insulation layer is described. The method includes: receiving a substrate having a low-k insulation layer formed thereon, a first hard mask layer overlying the low-k insulation layer, and a second hard mask layer overlying the first hard mask layer; preparing a first lithographic mask layer with a trench pattern formed therein on the second hard mask layer; transferring the trench pattern into the second hard mask layer and stopping on the first hard mask layer; removing the first lithographic mask layer; preparing a second lithographic mask layer with a via pattern formed therein on the second hard mask layer; transferring the via pattern through the first hard mask layer and at least partially through the low-k insulation layer; removing the second lithographic mask layer; transferring the trench pattern in the second hard mask layer through the first hard mask layer and into the low-k insulation layer to a pre-determined depth to form a trench-via structure; depositing a SiOCl-containing layer on exposed surfaces of the trench-via structure to form an insulation protection layer; performing one or more etching processes to anisotropically remove at least a portion of the SiOCl-containing layer from at least one surface on the trench-via structure; and removing the second hard mask layer using a mask removal etching process.

DETAILED DESCRIPTION OF SEVERAL EMBODIMENTS

Figure 1:
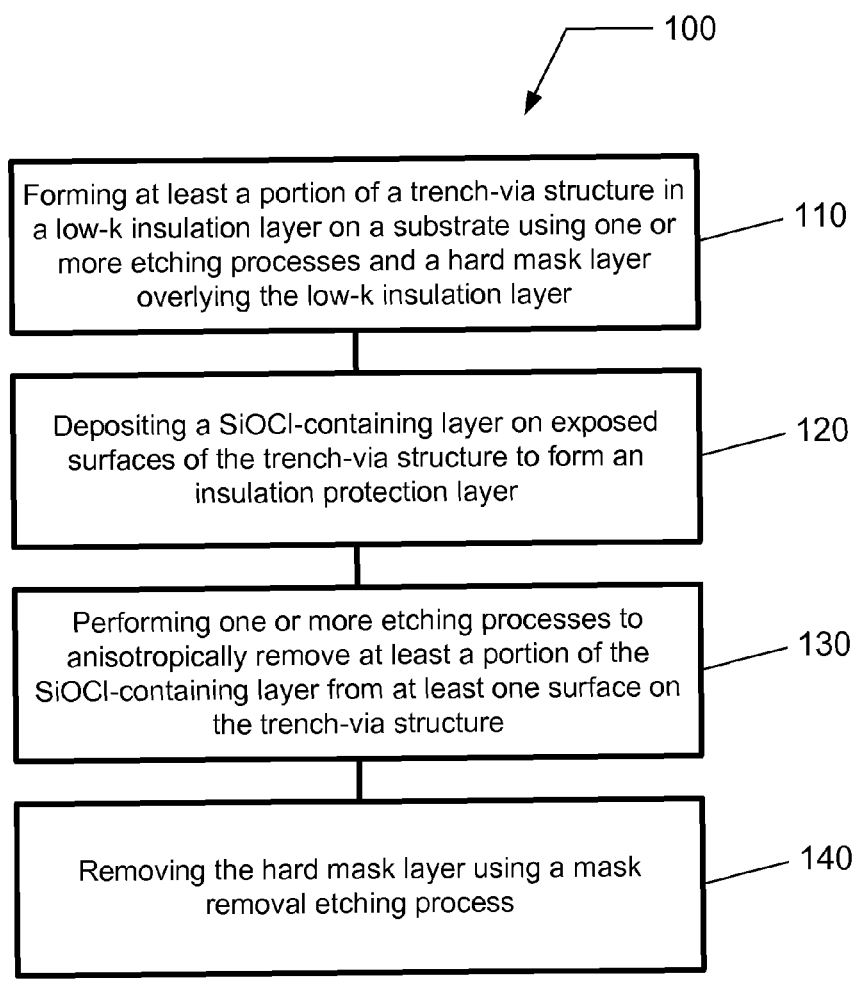
FIG. 1 illustrates a method for protecting an exposed low-k surface when removing a mask layer according to an embodiment.

In the following description, for purposes of explanation and not limitation, specific details are set forth, such as a particular geometry of a processing system, descriptions of various components and processes used therein. However, it should be understood that the invention may be practiced in other embodiments that depart from these specific details.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or un-patterned, but rather, is contemplated to include any such layer or base structure, and any combination of layers and/or base structures. The description below may reference particular types of substrates, but this is for illustrative purposes only and not limitation.

As noted above in semiconductor manufacturing, when fabricating insulation layer stacks for metal interconnects, the integration of low-k materials has posed many challenges. In particular, when patterning a low-k material, the low-k insulation layer is prepared on a substrate with a mask layer having a pattern formed therein overlying the low-k insulation layer. Thereafter, the pattern in the mask layer, e.g., a via pattern or a trench pattern, is transferred to the low-k insulation layer using one or more etching processes.

The one or more etching process may be performed to transfer the pattern either partially into or fully through the low-k insulation layer. However, the exposure of the low-k insulation layer to the etching chemistry (e.g., plasma chemistry) may cause initial damage to the low-k insulation layer, particularly along the sidewalls of the pattern formed therein. Furthermore, when the remaining portion of the mask layer is removed via an etching, ashing, and/or stripping process, additional damage may be incurred by the exposed portions of the low-k insulation layer.

In one example, when the mask layer contains organic material, such as photo-resist, the process for removing the mask layer typically uses an oxygen-containing chemistry, such as an oxygen-containing plasma, to remove the organic material. In such cases, the oxygen-containing chemistry may lead to the depletion of carbon, as well as methyl groups (i.e., $CH_3$) in the low-k insulation layer. The de-methylation of the low-k insulation layer is particularly evident in SiCOH-containing layers. As a result, the low-k insulation layer that has been damaged by these processes suffers from an increased dielectric constant, an increased leakage there through, and an increased hydrophilicity.

In another example, when the mask layer contains a metal, such as Ti or TiN, the process for removing the mask layer typically uses a fluorine-containing chemistry, such as a fluorine-containing plasma, to remove the metal-containing material. For instance, $NF_3$-based plasma has been used to remove metal hard mask layers containing TiN. However, fluorine-containing plasma etching may cause, among other things, mask undercut and sidewall bowing of the pattern formed in the low-k insulation layer, chamfer erosion, metal contamination of the low-k insulation layer due to sputtering and redeposition of the sputtered metal.

Therefore, according to various embodiments, a method for protecting an exposed low-k surface in order to reduce damage when removing a mask layer is described. The method is presented by way of a flow chart 100 in FIG. 1. As shown in FIG. 1, the flow chart 100 begins in 110 with forming at least a portion of a trench-via structure in a low-k insulation layer on a substrate using one or more etching processes and a hard mask layer overlying the low-k insulation layer. The trench-via structure may be prepared using any variety of conventional techniques, including, but not limited to, a single damascene integration scheme, a dual damascene integration scheme, a trench-first metal hard mask (TFMHM) integration scheme, a via-first-trench-last (VFTL) integration scheme, etc.

Figure 2A:
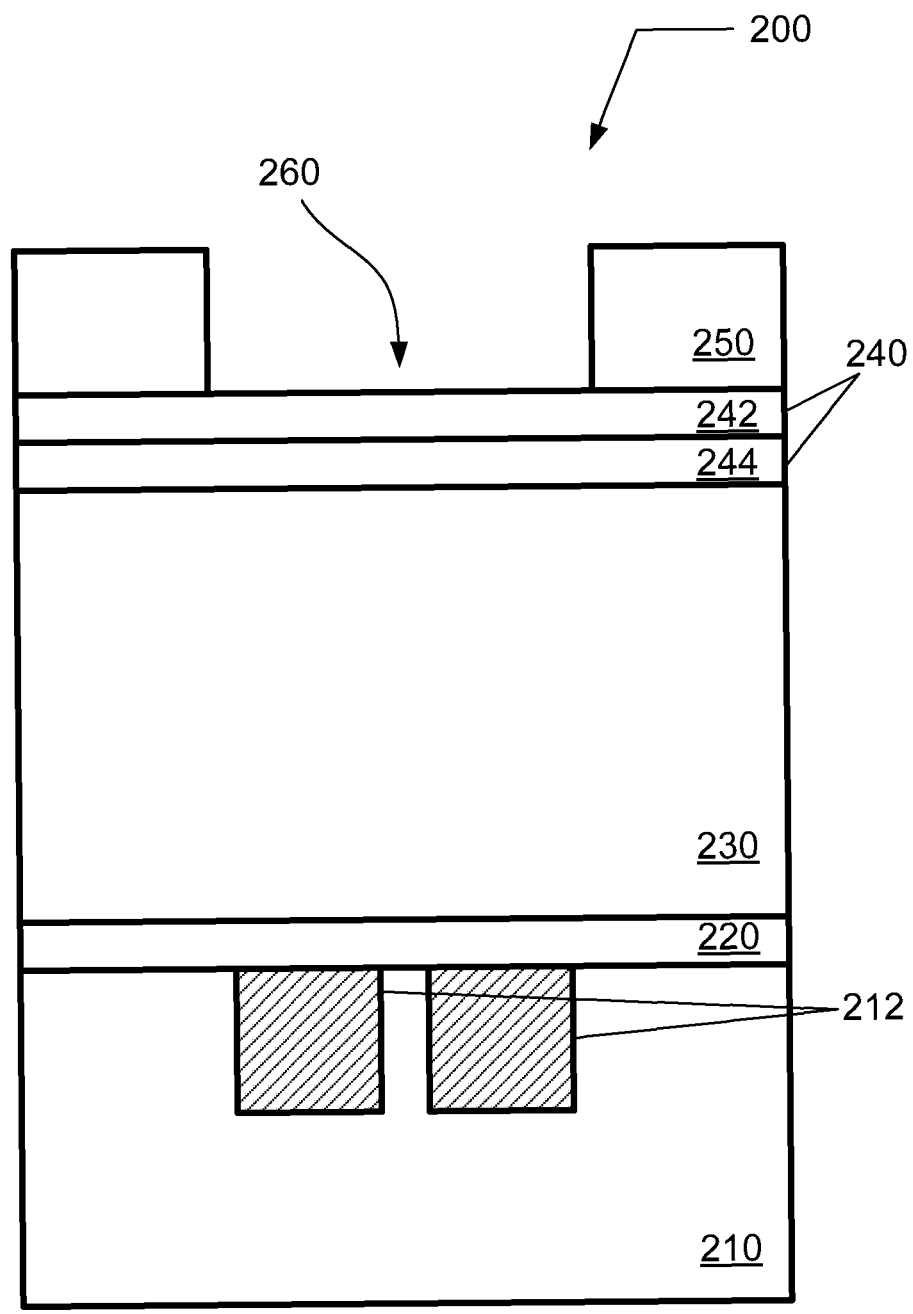
FIGS. 2A through 2J illustrate a schematic representation of a method for patterning a low-k insulation layer while protecting an exposed low-k surface when removing a mask layer according to an embodiment.

As an example, FIGS. 2A through 2J pictorially illustrate a TFMHM integration scheme for creating a trench-via structure 200 in a low-k insulation layer 230. As illustrated in FIG. 2A, a substrate 210 is received having the low-k insulation layer 230 formed thereon, and at least one hard mask layer 240 overlying the low-k insulation layer 230. The at least one hard mask layer 240 may include a first hard mask layer 244 overlying the low-k insulation layer 230, and a second hard mask layer 242 overlying the first hard mask layer 244. Additionally, at least one cap layer 220 may be inserted between the low-k insulation layer 230 and substrate 210.

As shown in FIGS. 2A through 2J, the trench-via structure 200 is formed in the low-k insulation layer 230 as well as a collection of other layers. Thereafter, the trench-via structure 200 is lined with one or more conformal thin films, wherein the one or more conformal thin films include a metal barrier layer, a metal adhesion layer, or a metal seed layer, or any combination of two or more thereof. After the liner is formed, the trench-via structure 200 is filled with metal, such as Cu, and planarized using, for example, chemical-mechanical planarization (CMP) to form a metal interconnect and achieve electrical contact to a metal line(s) 212 in substrate 210.

The substrate 210 may include a bulk silicon substrate, a single crystal silicon (doped or un-doped) substrate, a semiconductor-on-insulator (SOI) substrate, or any other semiconductor substrate containing, for example, Si, SiC, SiGe, SiGeC, Ge, GaAs, InAs, InP, as well as other III/V or II/VI compound semiconductors, or any combination thereof (Groups II, III, V, VI refer to the classical or old IUPAC notation in the Periodic Table of Elements; according to the revised or new IUPAC notation, these Groups would refer to Groups 2, 13, 15, 16, respectively). The substrate can be of any size, for example, a 200 mm (millimeter) substrate, a 300 mm substrate, a 450 mm substrate, or an even larger substrate. As described above, substrate 210 may include other layers, such as other interconnect layers previously formed to which electrical contact is to be made.

Low-k insulation layer 230 may include a low dielectric constant (i.e., low-k) or ultra-low dielectric constant (i.e., ultra-low-k) dielectric layer having a nominal dielectric constant value less than the dielectric constant of $SiO_2$, which is approximately 4 (e.g., the dielectric constant for thermal silicon dioxide can range from 3.8 to 3.9). More specifically, the low-k insulation layer 230 may have a dielectric constant of less than 3.7, or a dielectric constant of less than 2.5, or a dielectric constant ranging from 1.6 to 3.7. The low-k insulation layer 230 may be porous or non-porous.

For example, the low-k insulation layer 230 may include a SiCOH-containing material. Additionally, for example, the low-k insulation layer 230 may include a porous inorganic-organic hybrid film comprised of a single-phase, such as a silicon oxide-based matrix having $CH_3$ bonds that hinder full densification of the film during a curing or deposition process to create small voids (or pores). Still alternatively, for example, the low-k insulation layer 230 may include porous inorganic-organic hybrid film comprised of at least two phases, such as a carbon-doped silicon oxide-based matrix having pores of organic material (e.g., porogen) that is decomposed and evaporated during a curing process.

The low-k insulation layer 230 can be formed using a vapor deposition technique, such as chemical vapor deposition (CVD), plasma enhanced CVD (PECVD), atomic layer deposition (ALD), plasma enhanced ALD (PEALD), physical vapor deposition (PVD), or ionized PVD (iPVD), or a spin-on technique, such as those offered in the Clean Track ACT 8 SOD (spin-on dielectric), ACT 12 SOD, and Lithius coating systems commercially available from Tokyo Electron Limited (TEL). The Clean Track ACT 8 (200 mm), ACT 12 (300 mm), and Lithius (300 mm) coating systems provide coat, bake, and cure tools for SOD materials. The track system can be configured for processing substrate sizes of 100 mm, 200 mm, 300 mm, and greater. Other systems and methods for forming a thin film on a substrate are well known to those skilled in the art of both spin-on technology and vapor deposition technology.

As described above, the at least one hard mask layer 240 may include first hard mask layer 244 overlying the low-k insulation layer 230, and second hard mask layer 242 overlying the first hard mask layer 244. The first hard mask layer 244 may include a Si-containing material or C-containing material. The Si- or C-containing material may include silicon oxide ($Si_xO_y$), silicon nitride ($Si_xN_y$), silicon oxynitride ($Si_xO_yN_z$), silicon oxycarbide ($Si_xO_yC_z$), or carbon (diamond-like carbon (DLC), amorphous carbon (a-C), or graphite), together, or any combination thereof for example. Additionally, the second hard mask layer 242 may include a metal, or a metal-containing material. The second hard mask layer 242 may include titanium (Ti), titanium nitride ($TiN_y$), tantalum (Ta), tantalum nitride ($TaN_y$), aluminum (Al), or aluminum-copper alloy (Al—Cu). For example, the second hard mask layer 242 may include Ti or TiN.

The cap layer 220 may include a single layer or multiple layers. For example, the cap layer 220 may include a nitrogen doped silicon carbide or Si—N—C—H. Furthermore, for example, the cap layer 220 may include silicon nitride ($SiN_y$), silicon carbide ($SiC_y$), silicon carbonitride ($SiC_xN_y$), or $SiC_xN_yH_z$, or a combination of two or more thereof. The cap layer 220 can be formed using a vapor deposition process, such as chemical vapor deposition (CVD), or plasma enhanced CVD (PECVD). Furthermore, the cap layer 220 may include a graded layer disposed between the low-k insulation layer 230 and the cap layer 220, and/or between the cap layer 220 and the substrate 210.

As shown in FIG. 2A, a first lithographic mask layer 250 is prepared with a trench pattern 260 formed therein on the second hard mask layer 242. The first lithographic mask layer 250 may comprise a layer of radiation-sensitive material, such as photo-resist. The photo-resist may comprise 248 nm nanometer) resist, 193 nm resist, 157 nm resist, EUV (extreme ultraviolet) resist, or electron beam sensitive resist. The photo-resist can be formed using a track system. For example, the track system can comprise a Clean Track ACT 8, ACT 12, or Lithius resist coating and developing system commercially available from Tokyo Electron Limited (TEL). Other systems and methods for forming a photo-resist layer on a substrate are well known to those skilled in the art of spin-on resist technology.

Additionally, the first lithographic mask layer 250 may include an anti-reflective coating (ARC) layer, such as a silicon-containing ARC commercially available as Sepr-Shb Aseries SiARC from Shin Etsu Chemical Co., Ltd. The optional ARC layer may, for example, be applied using spin coating technology, or a vapor deposition process.

Furthermore, the first lithographic mask layer 250 may include an organic planarization layer (OPL) or organic dielectric layer (ODL). The ODL or OPL may include a photo-sensitive organic polymer or an etch type organic compound. For instance, the photo-sensitive organic polymer may be polyacrylate resin, epoxy resin, phenol resin, polyamide resin, polyimide resin, unsaturated polyester resin, polyphenylether resin, polyphenylenesulfide resin, or benzocyclobutene (BCB). These materials may be formed using spin-on techniques or vapor deposition techniques.

The trench pattern 260 may be formed in the first lithographic mask layer 250 using a sequence of lithography and optionally etching steps. Once prepared, the pattern (or series of prepared patterns) may be transferred to the underlying thin film, i.e., the at least one hard mask layer 240 and the low-k insulation layer 230, using one or more etching processes, such as one or more plasma etching processes.

Figure 2B:
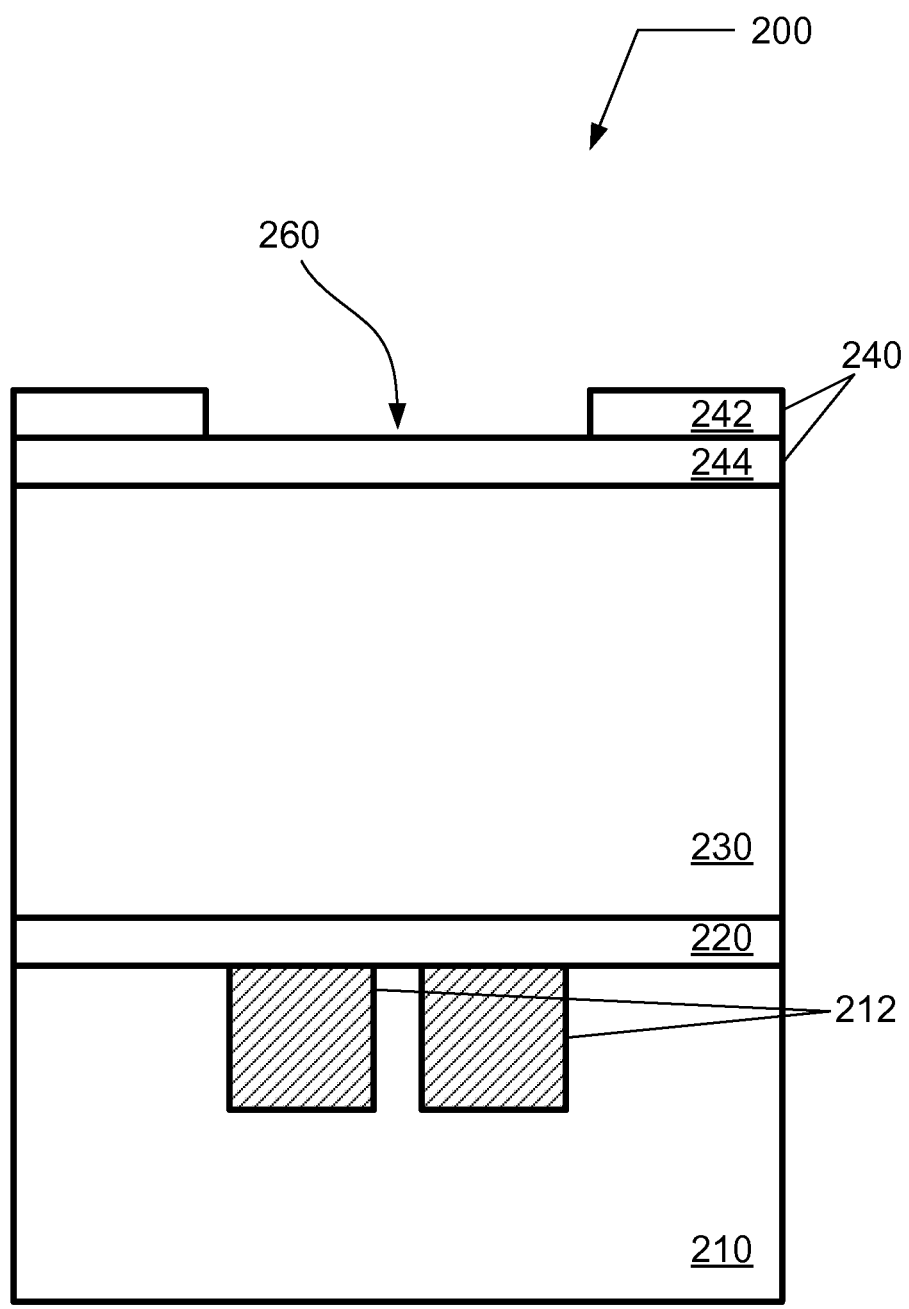

As shown in FIG. 2B, the trench pattern 260 is transferred into the second hard mask layer 242, and the transfer of the trench pattern 260 is stopped on the first hard mask layer 244. The transfer of the trench pattern 260 into the second hard mask layer 242 includes performing one or more etching processes, such as one or more plasma etching processes. Thereafter, the first lithographic mask layer 250 is removed using one or more ashing and/or stripping processes.

Figure 2C:
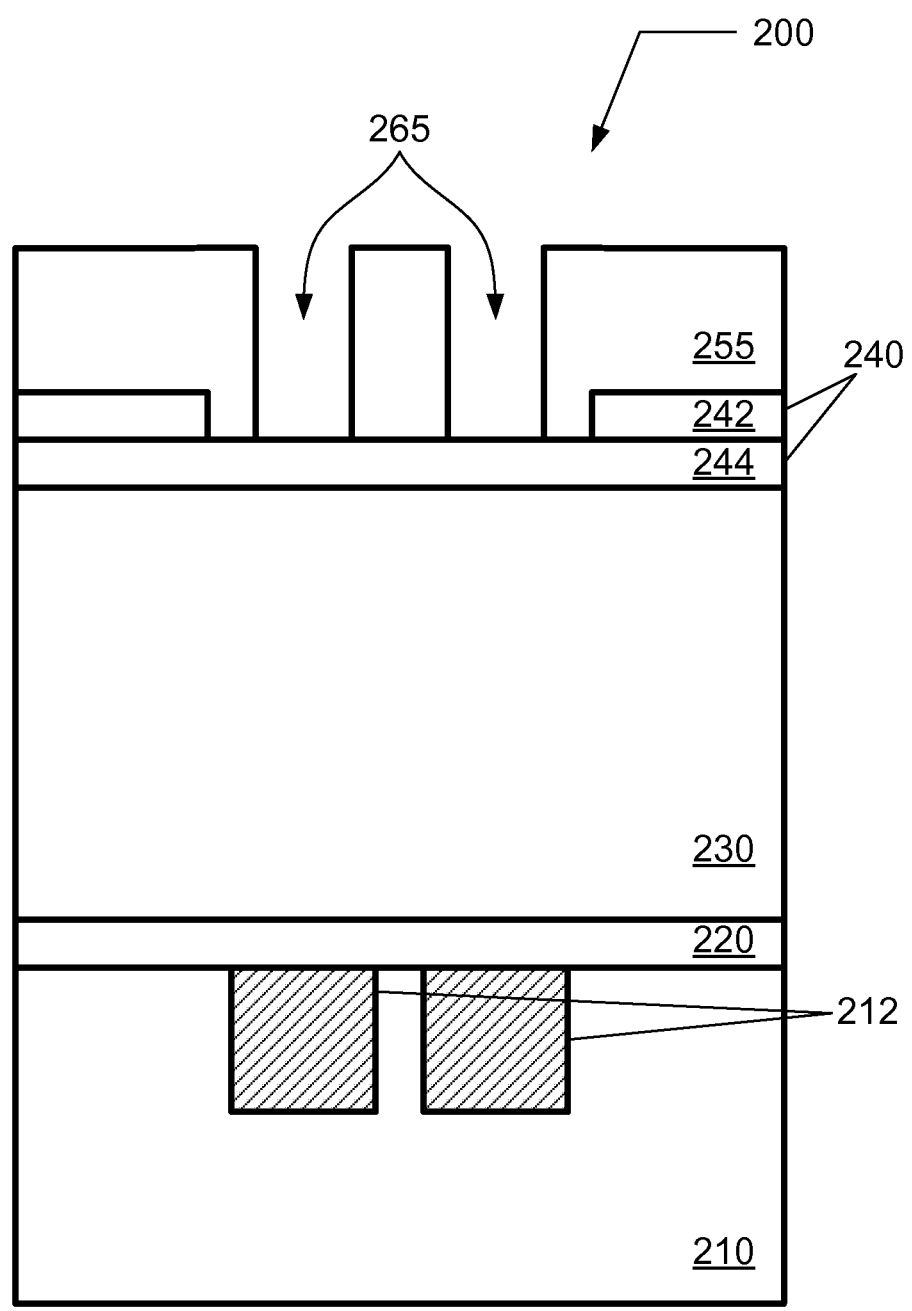

As shown in FIG. 2C, a second lithographic mask layer 255 is prepared with a via pattern 265 formed therein on the second hard mask layer 242. The second lithographic mask layer 255 may comprise a layer of radiation-sensitive material, such as photo-resist. The photo-resist may comprise 248 nm nanometer) resist, 193 nm resist, 157 nm resist, EUV (extreme ultraviolet) resist, or electron beam sensitive resist. The photo-resist can be formed using a track system. For example, the track system can comprise a Clean Track ACT 8, ACT 12, or Lithius resist coating and developing system commercially available from Tokyo Electron Limited (TEL). Other systems and methods for forming a photo-resist layer on a substrate are well known to those skilled in the art of spin-on resist technology.

Figure 2D:
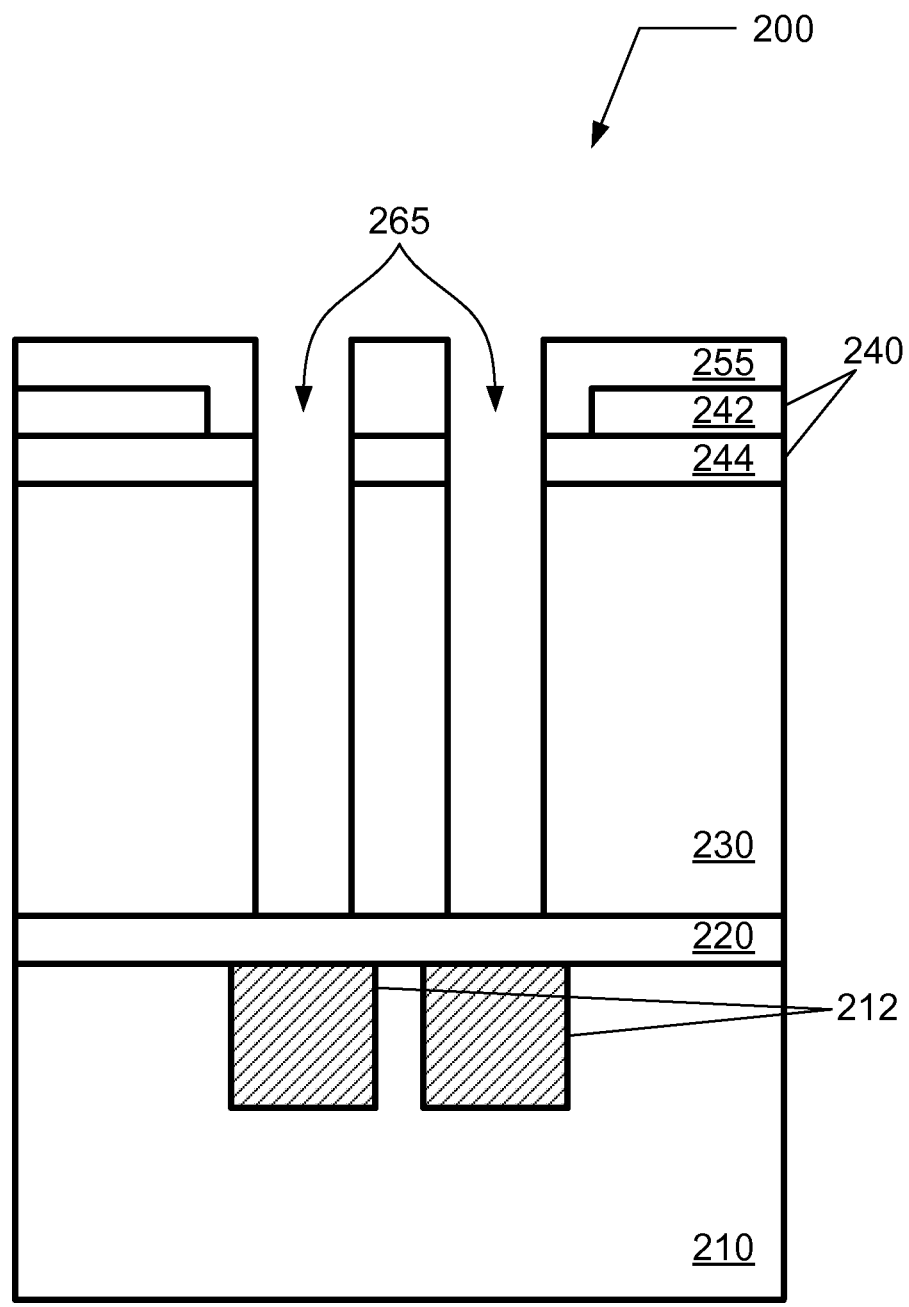
Figure 2E:
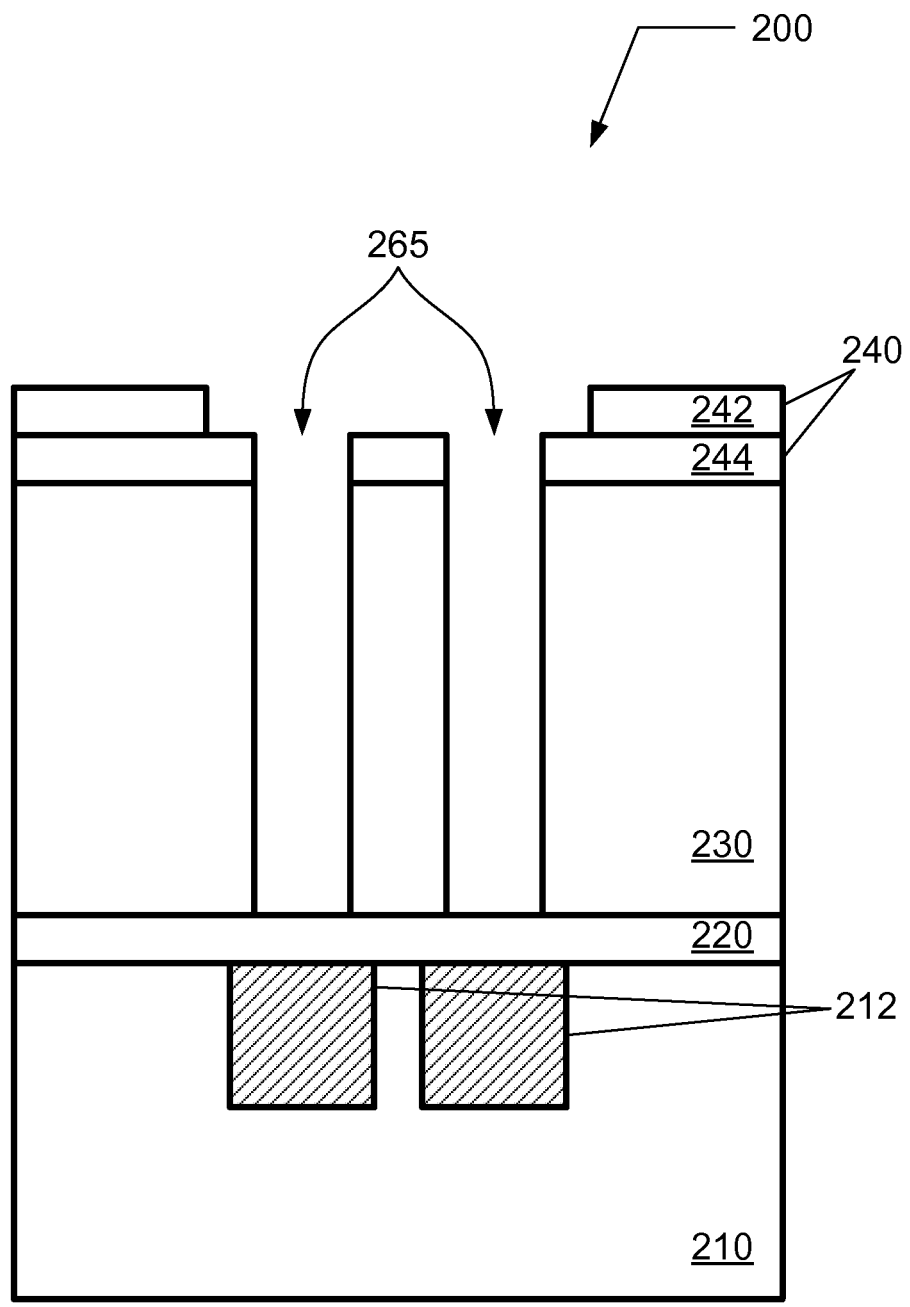

As shown in FIG. 2D, the via pattern 265 is transferred through the first hard mask layer 244, and at least partially through the low-k insulation layer 230. The transfer of the via pattern 265 into the low-k insulation layer 230 includes performing one or more etching processes, such as one or more plasma etching processes. Thereafter, as shown in FIG. 2E, the second lithographic mask layer 255 is removed using one or more ashing and/or stripping processes.

Figure 2F:
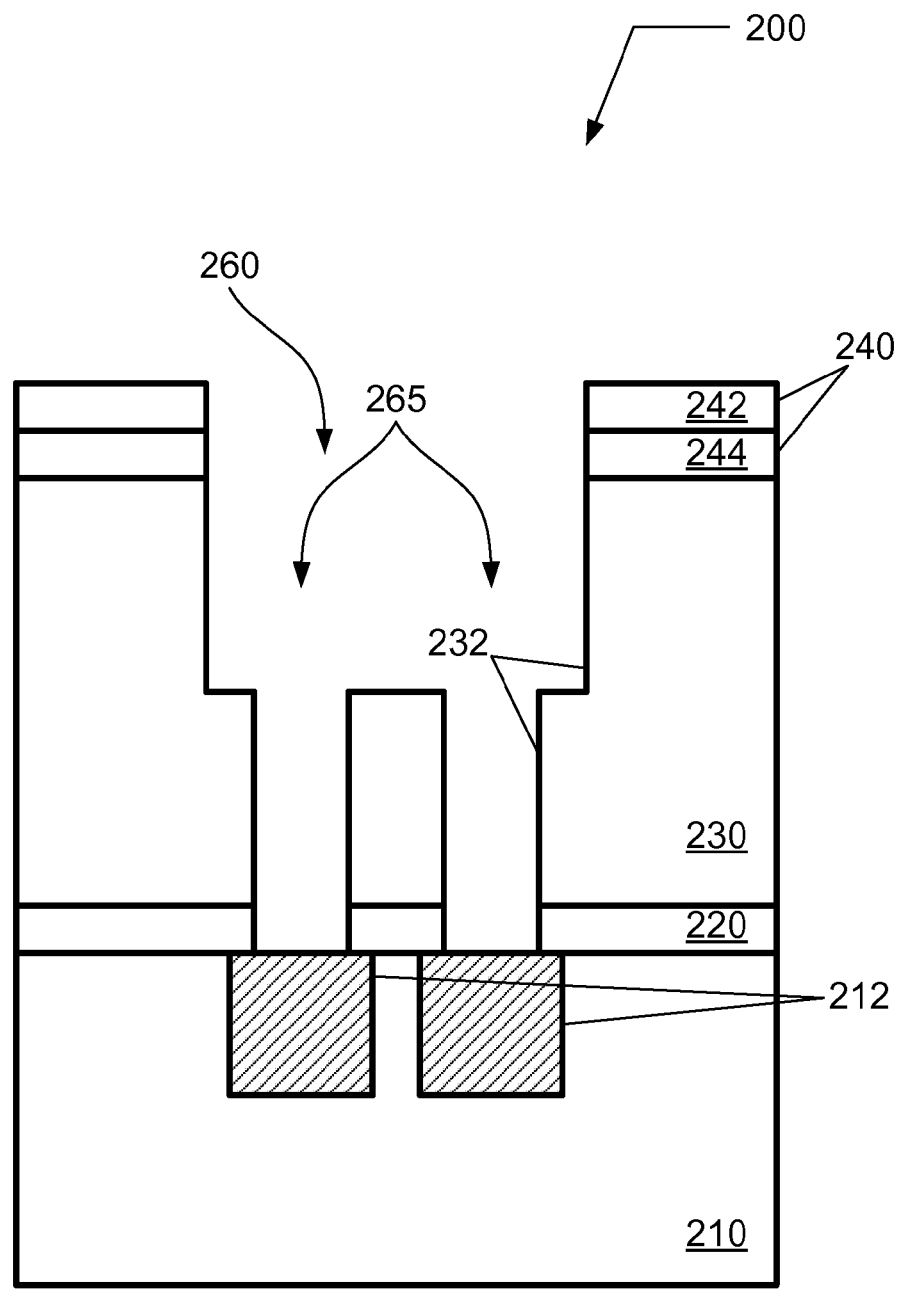

As shown in FIG. 2F, the trench pattern 260 in the second hard mask layer 242 is transferred through the first hard mask layer 244 and into the low-k insulation layer 230 to a predetermined depth to form trench-via structure 200. During the transfer of the trench pattern 260 to the low-k insulation layer 230, the via pattern 265 may be completely transferred through the low-k insulation layer 230 and/or through the cap layer 220 to expose sidewall surfaces 232.

Figure 2G:
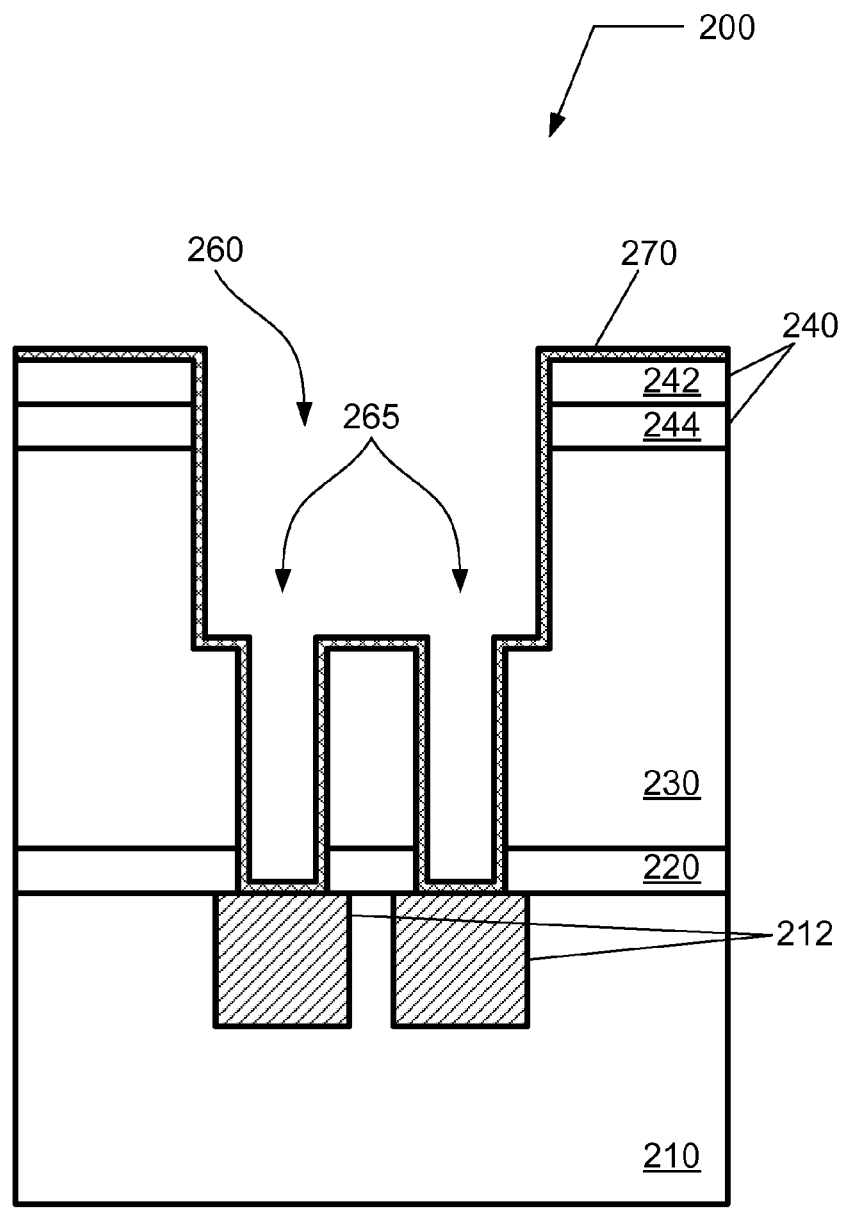

In 120 and as shown in FIG. 2G, a SiOCl-containing layer is deposited on exposed surfaces of the trench-via structure 200 to form an insulation protection layer 270. The SiOCl-containing layer contains Si, O, and Cl. The SiOCl-containing layer may be formed by performing a vapor deposition process in an environment containing Si, Cl, and O.

In one embodiment, the SiOCl-containing layer is formed by performing a plasma-assisted deposition process that includes generating plasma using a film forming process composition containing as incipient ingredients $SiCl_4$ and $O_2$. While the film forming process composition includes $SiCl_4$ and $O_2$, other Cl-containing and O-containing gases or vapors are contemplated. For example, the film forming process composition may include as incipient ingredients silane ($SiH_4$), a Cl-containing gas (e.g., $Cl_2$, HCl, etc.), and an oxygen-containing gas (e.g., $O_2$).

To form the plasma in the plasma-assisted deposition process, constituents of the film forming process composition should be selected that exist in a gaseous and/or vapor phase either alone or in combination with a carrier gas (e.g., a noble gas element or nitrogen) at atmospheric and/or vacuum pressures.

The plasma-assisted deposition process may exclude application of a radio frequency (RF) bias to a substrate holder upon which substrate 210 rests. A temperature of substrate 210 may range from about 0 degrees C. to about 100 degrees C. Furthermore, when forming the SiOCl-containing layer, at least one process parameter may be adjusted in the plasma-assisted deposition process to increase an etch resistance of the SiOCl-containing layer to a subsequent etching, ashing, and/or stripping process that may be used to remove the second hard mask layer 242.

In another embodiment, the SiOCl-containing layer is formed by exposing substrate 210 to $SiCl_4$ and $H_2O$, and heating substrate 210. A temperature of substrate 210 may range from about 30 degrees C. to about 100 degrees C.

Figure 2H:
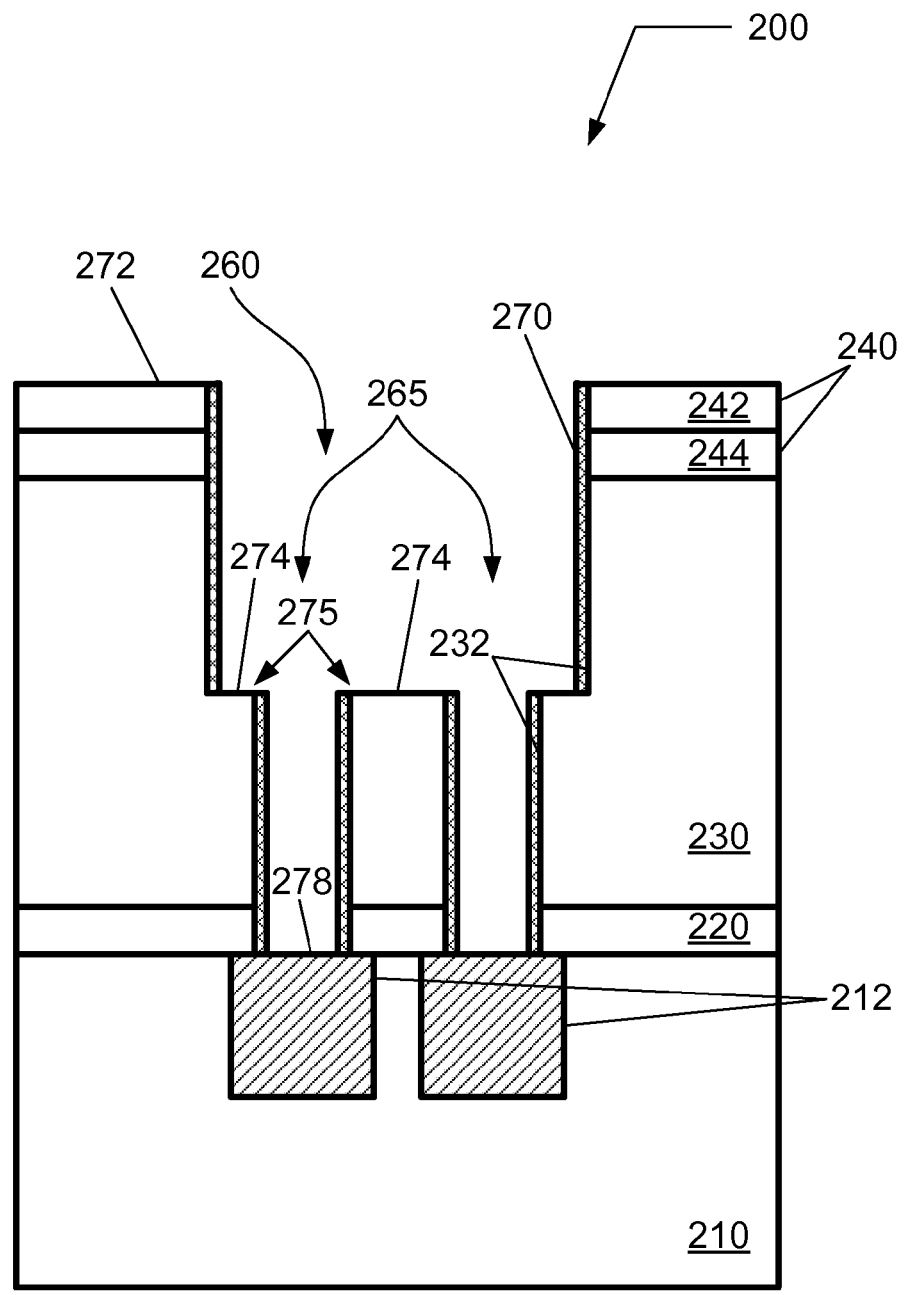

In 130 and as shown in FIG. 2H, one or more etching processes are performed to anisotropically remove at least a portion of the SiOCl-containing layer from at least one surface on the trench-via structure 200. For example, the SiOCl-containing layer may be anisotropically removed from a top surface 272 of the second hard mask layer 242, a bottom surface 274 of the trench pattern 260, and a bottom surface 278 of via pattern 265, while retaining a remaining portion of the SiOCl-containing layer on sidewall surfaces 232 of the trench-via structure 200. The remaining portion of the SiOCl-containing layer in the trench-via structure 200 may protect the sidewall surfaces 232 and a chamfer 275 at corners where sidewall surfaces 232 of via pattern 265 meet the bottom surface 274 of the trench pattern 260. The removal of the SiOCl-containing layer from at least one surface on the trench-via structure 200 may be performed using one or more etching processes. The one or more etching process may include a dry plasma etching process or a dry non-plasma etching process.

In one embodiment, the dry plasma etching process includes an anisotropic plasma etching process. The anisotropic plasma etching process may include forming plasma from an etching process composition that contains C and F. For example, the etching process composition may include a fluorocarbon (i.e., $C_xF_y$, where x and y are equal to unity or greater).

Additionally, for example, the etching process composition may include a halomethane gas. The halomethane gas may include a mono-substituted halomethane (e.g., $CH_3F$), a di-substituted halomethane (e.g., $CH_2F_2$), a tri-substituted halomethane (e.g., $CHF_3$), or a tetra-substituted halomethane (e.g., $CF_4$).

Additionally, for example, the etching process composition may include a hydrocarbon (i.e., $C_xH_y$, where x and y are equal to unity or greater). Alternatively, for example, the etching process composition may include an additive gas having the chemical formula $C_xH_yR_z$, where R is a halogen element, x and y are equal to unity or greater, and z is equal to zero or greater.

Furthermore, for example, the etching process composition may include a noble gas. The etching process composition may include an oxygen-containing gas, a hydrogen-containing gas, a nitrogen-containing gas, or a carbon-containing gas, or any combination of two or more thereof. For example, the etching process composition may include $H_2$, $O_2$, $N_2$, CO, $CO_2$, $NH_3$, NO, $N_2O$, or $NO_2$, or any combination of two or more thereof. The etching process composition may further include a fluorine-containing gas, a chlorine-containing gas, a bromine-containing gas, or a halide gas. For example, the etching process composition may further include HBr, $F_2$, $Cl_2$, $Br_2$, $BCl_3$, $NF_3$, or $SF_6$.

In one embodiment, the etching process composition for the anisotropic plasma etching process may include a noble gas and one or more gases selected from the group consisting of $CF_4$, $C_4F_6$, $C_4F_8$, and $C_5F_8$. In another embodiment, the etching process composition for the anisotropic plasma etching process may include $CF_4$ and Ar.

The anisotropic plasma etching process may include preparation of an etch process recipe. The etch process recipe may include one or more process conditions defined by one or more process parameters. The one or more process conditions may be established by setting one or more process parameters, such as: setting a flow rate of each constituent of the etching process composition; setting a pressure in the plasma processing system; setting a first radio frequency (RF) power level for a first RF signal applied to a lower electrode within a substrate holder for supporting and electrically biasing the substrate; setting a second RF (or microwave) power level for a second RF signal applied to the lower electrode, or a source antenna or upper electrode opposing the lower electrode above the substrate; setting a temperature condition for the plasma processing system; setting a temperature condition for the substrate or substrate holder; setting an etch time; and/or setting an over-etch time. During the anisotropic plasma etching process, any one of the process parameters may be varied.

The anisotropic plasma etching process may include application of a radio frequency (RF) bias to a substrate holder upon which substrate 210 rests. A temperature of substrate 210 may range from about 0 degrees C. to about 100 degrees C. Furthermore, when performing the anisotropic plasma etching process, at least one process parameter may be adjusted in the anisotropic plasma etching process to control a critical dimension (CD) of the trench-via structure 200, a sidewall profile of the trench-via structure 200, etc.

In another embodiment, an over-etch process may be performed.

Figure 2I:
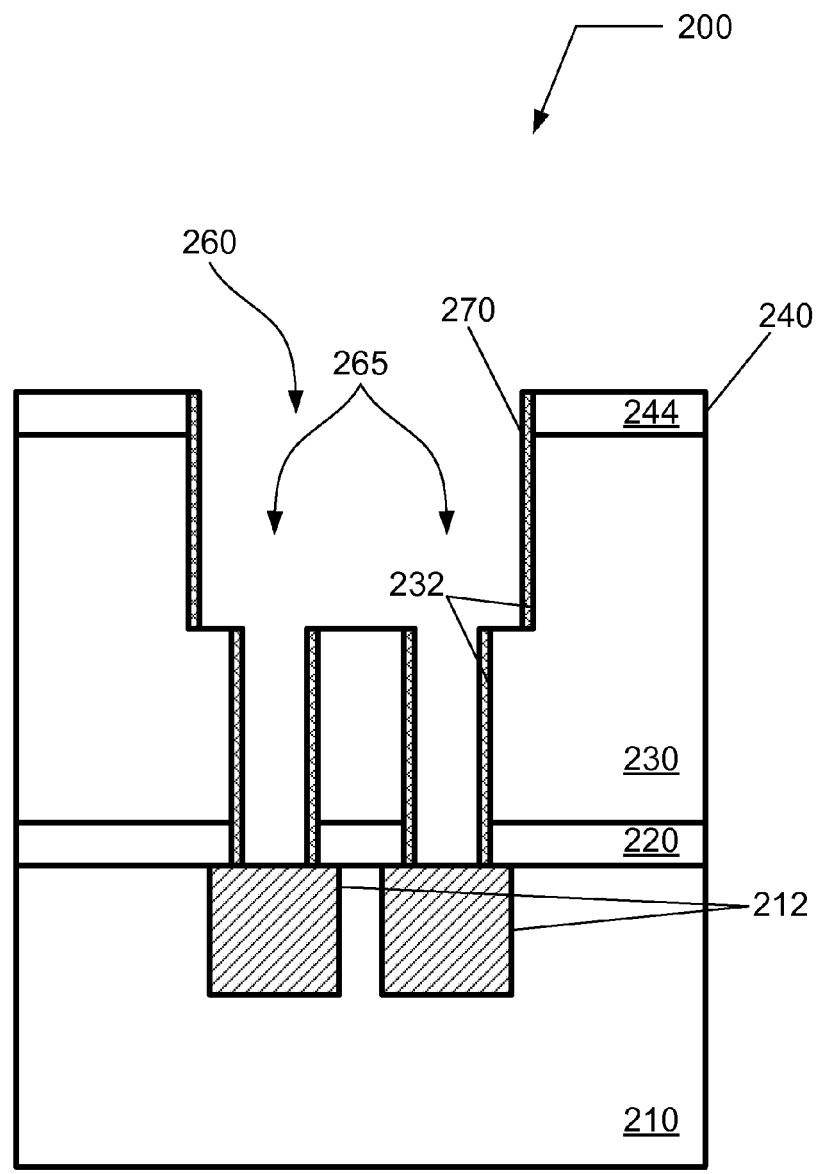

In 140 and as shown in FIG. 2I, a mask removal etching process is performed to remove at least a portion of the second hard mask layer 242. The mask removal etching process may include one or more etching processes. The one or more etching processes may include a dry plasma etching process or a dry non-plasma etching process.

In one embodiment, the dry plasma etching process may include forming plasma from an etching process composition that contains a halogen. For example, the etching process composition may include a fluorine-containing gas, a chlorine-containing gas, a bromine-containing gas, a halide gas, a halocarbon gas (i.e., $C_xR_y$, where R is a halogen element, and x and y are equal to unity or greater), a halohydrocarbon gas ($C_xH_yR_z$, where R is a halogen element, and x and y are equal to unity or greater, and z is equal to zero or greater), or a halomethane gas (e.g., a mono-substituted halomethane, such as $CH_3F$, or a di-substituted halomethane, such as $CH_2F_2$, or a tri-substituted halomethane, such as $CHF_3$, or a tetra-substituted halomethane, such as $CF_4$). Additionally, for example, the etching process composition may include HF, HCl, HBr, $F_2$, $Cl_2$, $Br_2$, $BCl_3$, $NF_3$, or $SF_6$.

Additionally, the dry plasma etching process may include forming plasma from an etching process composition that contains F. For example, the etching process composition may include HF, $NF_3$, $SF_6$, a fluorocarbon gas (i.e., $C_xF_y$, where x and y are equal to unity or greater), a fluorohydrocarbon gas ($C_xH_yF_z$, where x and y are equal to unity or greater, and z is equal to zero or greater), or a fluoromethane gas (e.g., a mono-substituted fluoromethane, such as $CH_3F$, or a di-substituted fluoromethane, such as $CH_2F_2$, or a tri-substituted fluoromethane, such as $CHF_3$, or a tetra-substituted fluoromethane, such as $CF_4$).

Furthermore, for example, the etching process composition may include a noble gas. The etching process composition may include an oxygen-containing gas, a hydrogen-containing gas, a nitrogen-containing gas, or a carbon-containing gas, or any combination of two or more thereof. For example, the etching process composition may include $H_2$, $O_2$, $N_2$, CO, $CO_2$, $NH_3$, NO, $N_2O$, or $NO_2$, or any combination of two or more thereof.

In one embodiment, the etching process composition for the mask removal etching process may include $NF_3$ and optionally a noble gas. In another embodiment, the etching process composition for the mask removal etching process may include $NF_3$ and Ar. In yet another embodiment, the etching process composition for the mask removal etching process may consist of $NF_3$.

The mask removal etching process may include preparation of an etch process recipe. The etch process recipe may include one or more process conditions defined by one or more process parameters. The one or more process conditions may be established by setting one or more process parameters, such as: setting a flow rate of each constituent of the etching process composition; setting a pressure in the plasma processing system; setting a first radio frequency (RF) power level for a first RF signal applied to a lower electrode within a substrate holder for supporting and electrically biasing the substrate; setting a second RF (or microwave) power level for a second RF signal applied to the lower electrode, or a source antenna or upper electrode opposing the lower electrode above the substrate; setting a temperature condition for the plasma processing system; setting a temperature condition for the substrate or substrate holder; setting an etch time; and/or setting an over-etch time. During the mask removal etching process, any one of the process parameters may be varied.

Figure 2J:
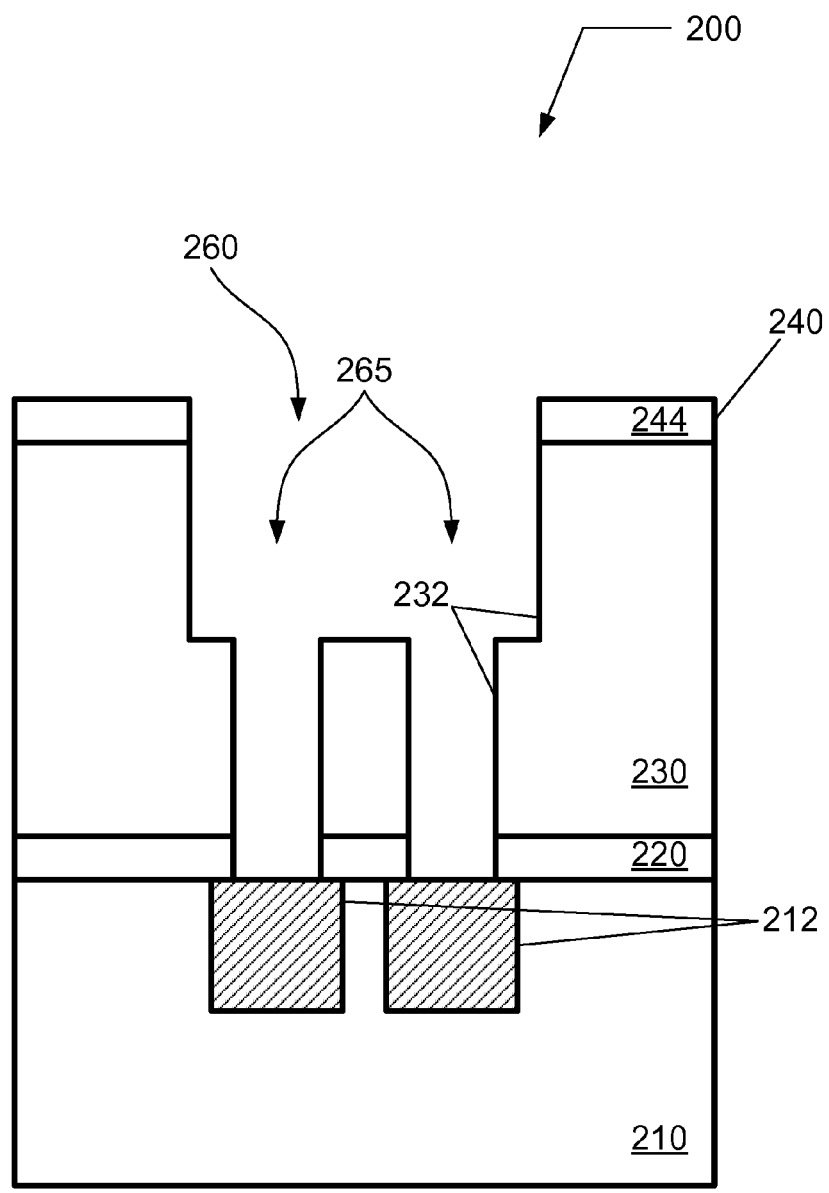

As illustrated in FIG. 2J, following the performing of the mask removal etching process, the remaining portion of the insulation protection layer 270 may be selectively removed from the sidewall surfaces 232 of trench-via structure 200. In one embodiment, the selective removal of the remaining portion of the insulation protection layer 270 from the sidewall surfaces 232 of the trench-via structure 200 is achieved by performing a wet cleaning process. For example, the wet cleaning process may include immersing the remaining portion of the SiOCl-containing material in an HF solution, such as a dilute aqueous HF solution.

In one embodiment, the deposition process for forming the SiOCl-containing layer, the anisotropic plasma etching process, and the mask removal etching process are performed in the same plasma processing system. In an alternate embodiment, the deposition process for forming the SiOCl-containing layer, the anisotropic plasma etching process, and the mask removal etching process are performed in separate plasma processing systems.

Figure 3A:
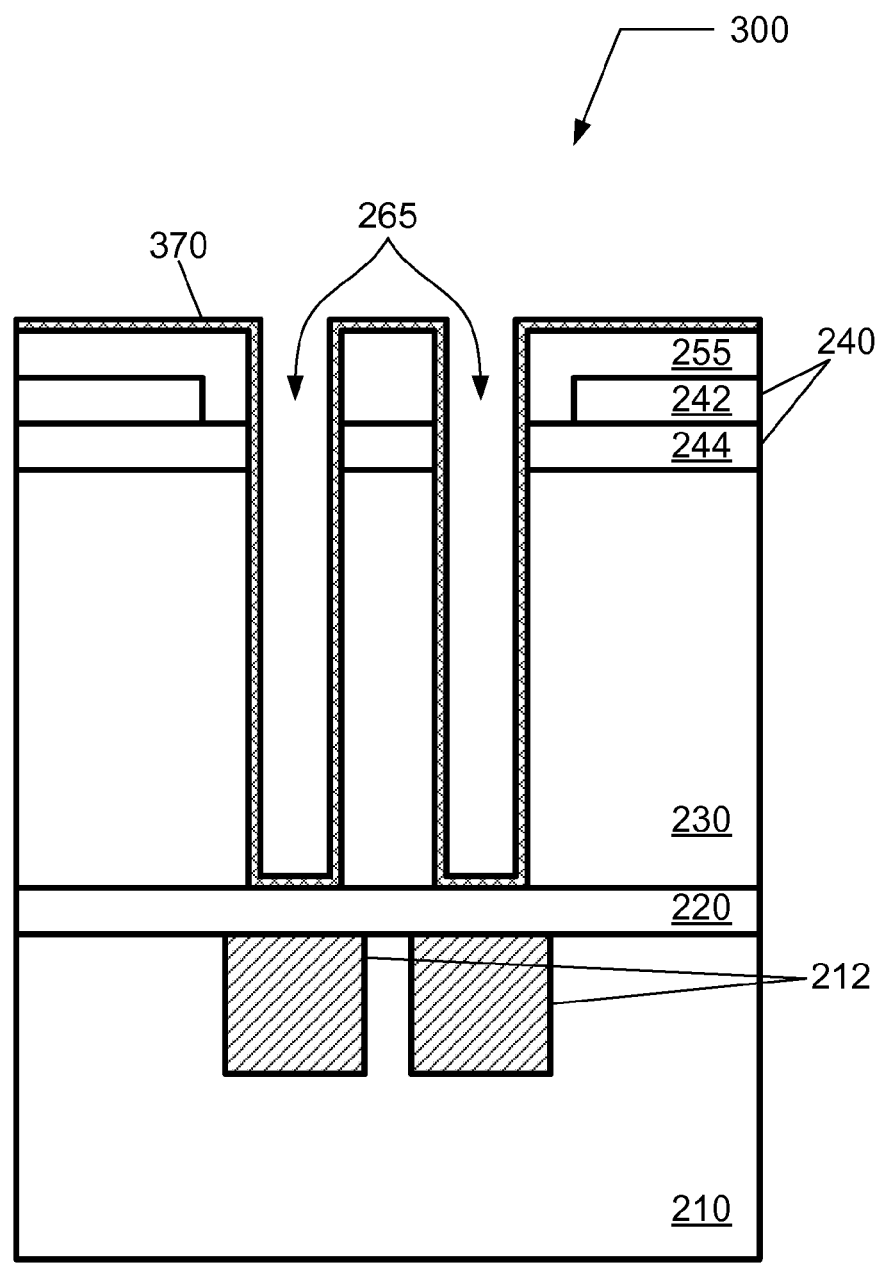
FIGS. 3A through 3B illustrate a schematic representation of a method for patterning a low-k insulation layer while protecting an exposed low-k surface when removing a mask layer according to another embodiment.
Figure 3B:
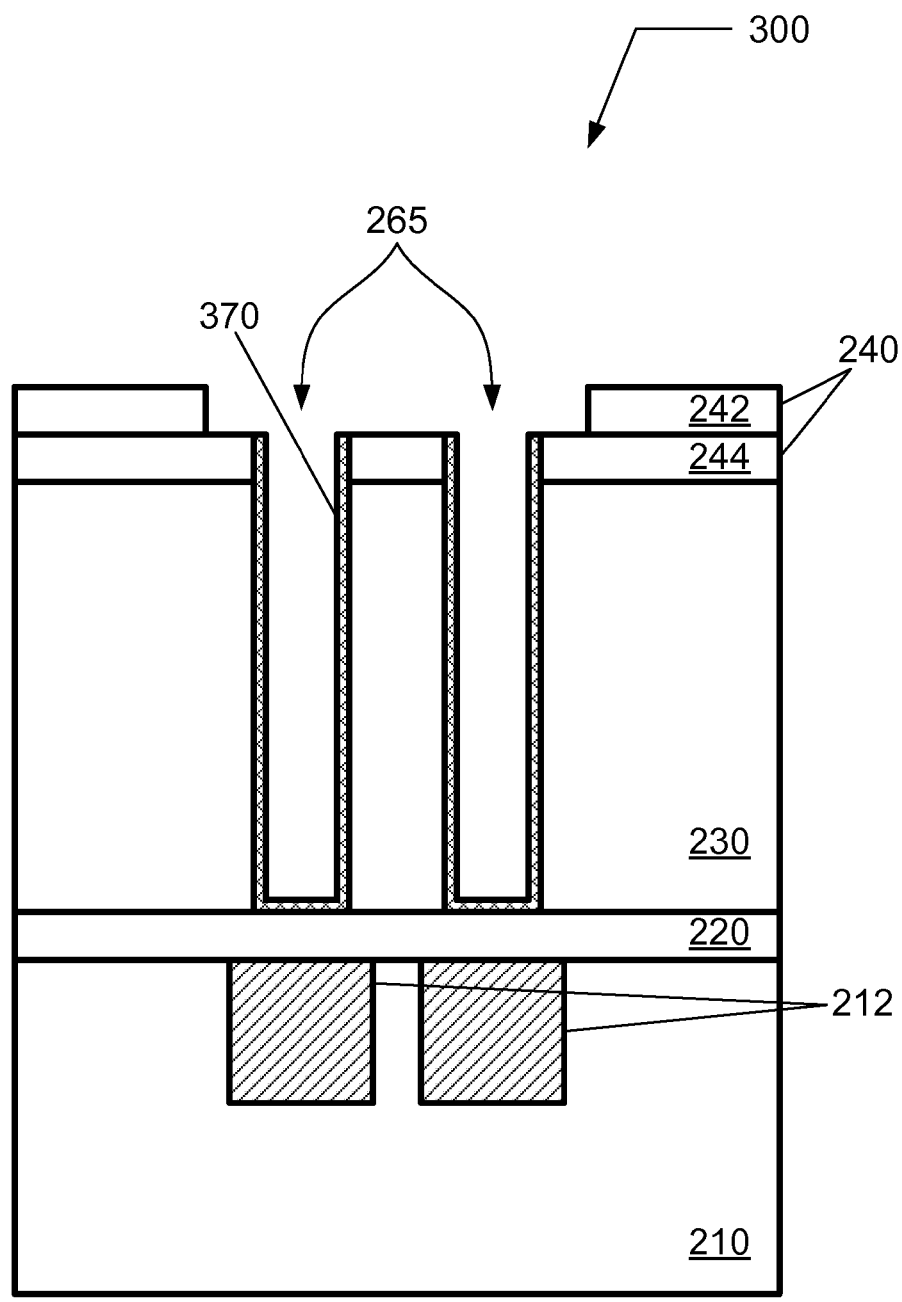

In another embodiment, a SiOCl-containing material may be deposited before and/or after other steps during the formation of a trench-via structure. As an example, a method for protecting an exposed low-k surface in via pattern 265 of a trench-via structure 300 is illustrated in FIGS. 3A and 3B. As shown in FIG. 3A, following the transferring of the via pattern 265 and prior to transferring the trench pattern 260 into the low-k insulation layer 230, a provisional SiOCl-containing layer may be deposited on exposed surfaces of the via pattern 265 within the trench-via structure 300 to form a via insulation protection layer 370. Immediately following the depositing of the provisional SiOCl-containing layer and preceding the removing of the second lithographic mask layer 255, one or more etching processes may be performed to anisotropically remove at least a portion of the provisional SiOCl-containing layer from at least one surface on the trench-via structure 300. Thereafter, the second lithographic mask layer 255 may be removed as shown in FIG. 3B.

In yet another embodiment, a SiOCl-containing material may be deposited at multiple stages during a pattern transfer process. In particular, the transfer of the trench pattern 260 and/or via pattern 265 may be performed in discrete etching steps, wherein periodic formation of a SiOCl-containing layer and optional anisotropic removal of at least a portion of the SiOCl-containing layer is inserted between at least one consecutive sequence of discrete etching steps and possibly repeated multiple cycles, e.g., two or more cycles until the sidewall surfaces 232 of a trench-via structure are adequately protected.

Figure 4A:
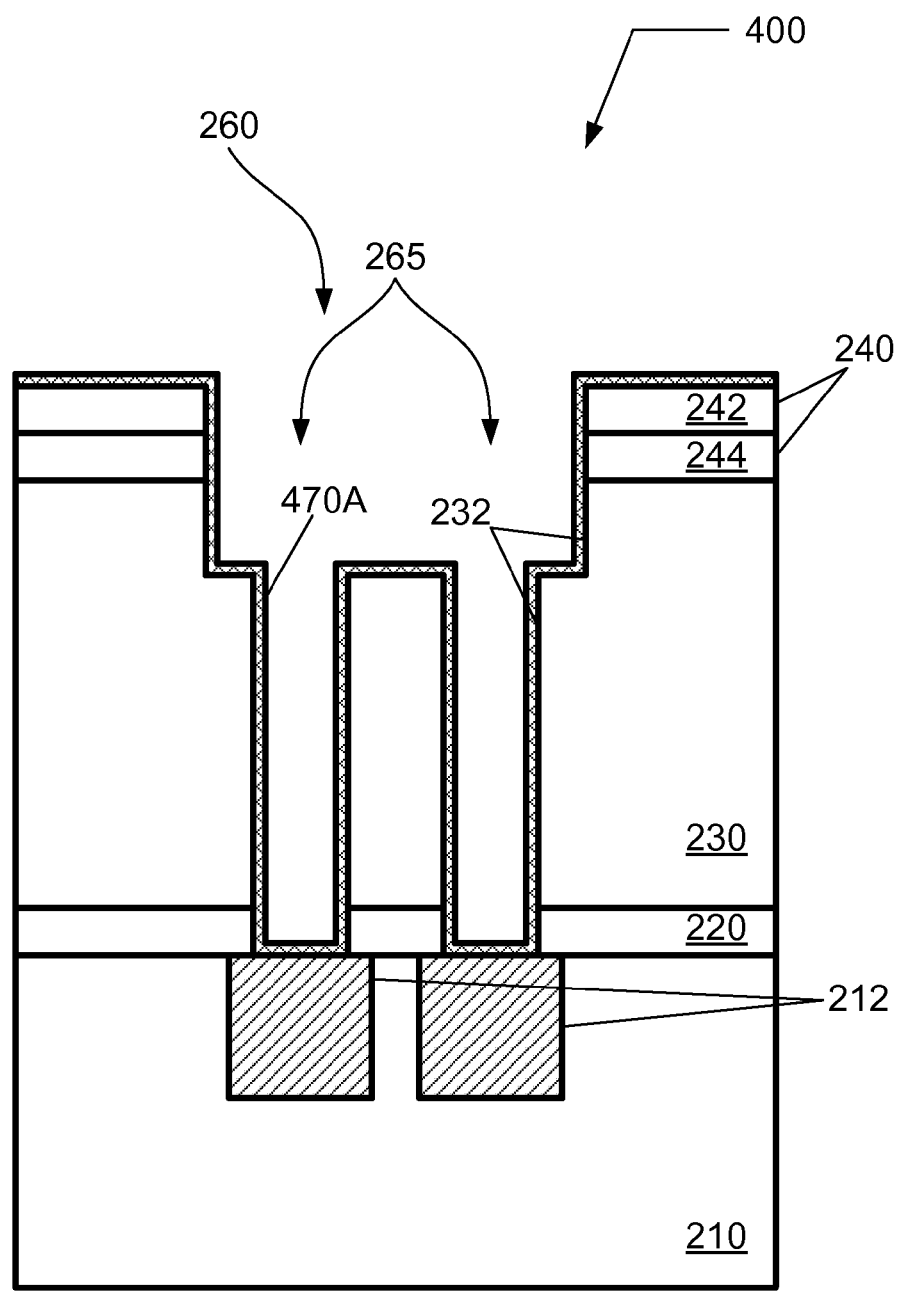
FIG. 4A through 4C illustrate a schematic representation of a method for patterning a low-k insulation layer while protecting an exposed low-k surface when removing a mask layer according to yet another embodiment.

As an example, a method for protecting an exposed low-k surface in trench pattern 260 of a trench-via structure 400 is described. The method is pictorially illustrated in FIGS. 4A through 4C. As illustrated in FIG. 4A, the trench pattern 260 is partially transferred from the second hard mask layer 242 through the first hard mask layer 244 and into the low-k insulation layer 230 using one or more etching processes to form at least the initial stage of the trench-via structure 400. The initial stage for the transfer of the trench pattern 260 to the low-k insulation layer 230 may be performed to a first trench depth less than the pre-determined depth defined for the trench-via structure 400. At the first trench depth, an intermediate SiOCl-containing layer is deposited on exposed surfaces of the trench-via structure 400 to form a first insulation protection layer 470A.

Figure 4B:
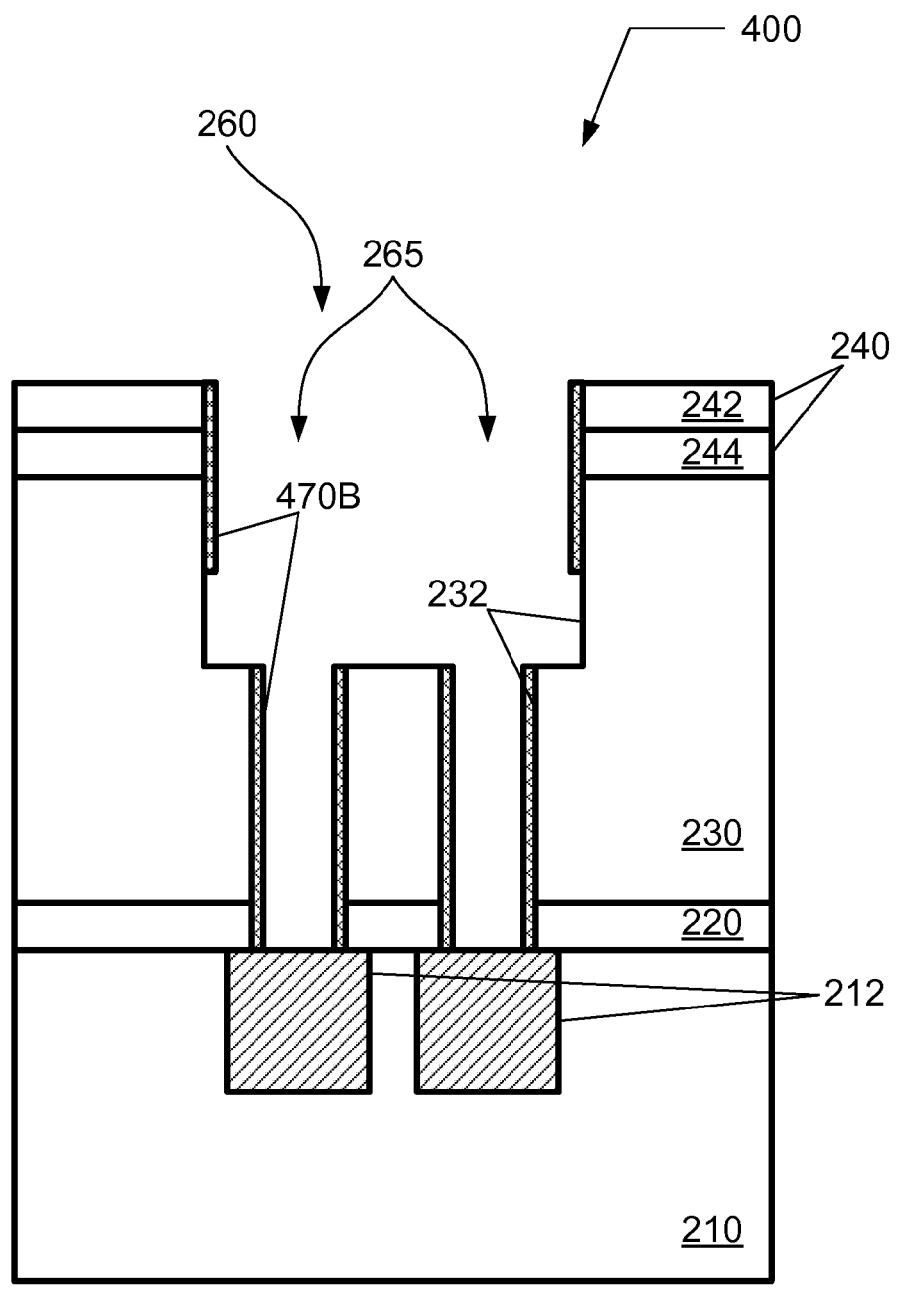

Thereafter, as illustrated in FIG. 4B, the trench pattern 260 is evolved deeper into the low-k insulation layer 230 using one or more additional etching processes. This subsequent stage for the transfer of the trench pattern 260 to the low-k insulation layer 230 may be performed to a second trench depth equal to or less than the pre-determined depth defined for the trench-via structure 400. As shown in FIG. 4B, during the one or more additional etching processes, the first insulation protection layer 470A may be at least partially removed from the second hard mask layer 442 and possibly thinned along the sidewall surfaces 232 of the trench-via structure 400 in low-k insulation layer 230 to leave a residual insulation protection layer 470B. The presence of the residual insulation protection layer 470B on the sidewalls of the evolving trench-via structure 400 may reduce interaction of the low-k insulation layer 230 with the etching chemistry, e.g., plasma chemistry, of the one or more additional etching process.

Figure 4C:
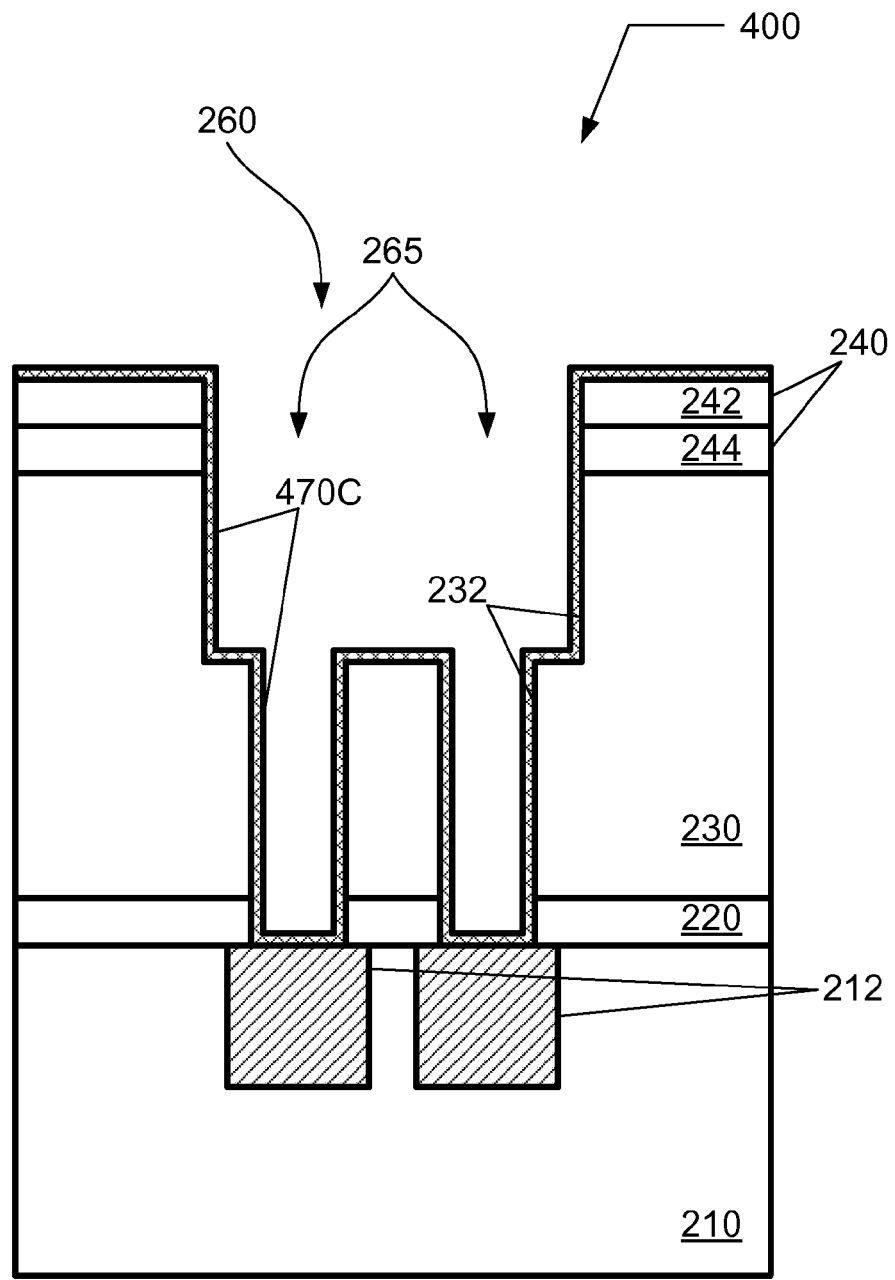

Then, as illustrated in FIG. 4C, another SiOCl-containing layer may be deposited on exposed surfaces of the trench-via structure 400 to form a second insulation protection layer 470C. The sequence of steps, i.e., the etch-deposit-etch-deposit (etc.) scheme described in FIGS. 4A through 4C performed during formation of the trench-via structure 400 into and through low-k insulation layer 230, may protect the sidewalls of the evolving trench-via structure 400 and, thus, limit interaction between the low-k insulation layer 230 and the etch chemistry. The limited interaction may reduce the damage to the low-k insulation layer 230. While described in the context of trench patterning, the etch-deposit sequence may also be performed during via patterning.

One or more of the methods for performing any one of the deposition processes for forming the SiOCl-containing layer, the anisotropic plasma etching process, and the mask removal etching process according to various embodiments described above may be performed in any one of the plasma processing systems illustrated in FIGS. 5 through 11 and described below.

Figure 5:
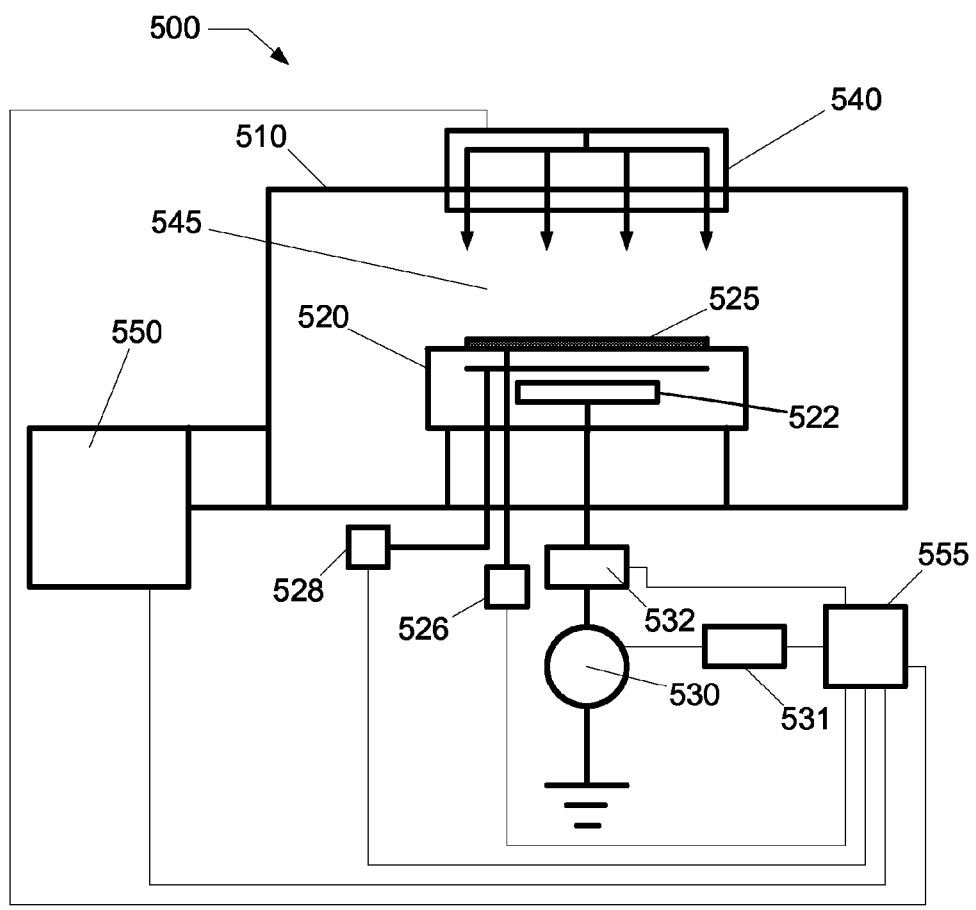
FIG. 5 shows a schematic representation of a plasma processing system according to an embodiment.

According to one embodiment, a plasma processing system 500 configured to perform the above identified process conditions is depicted in FIG. 5 comprising a plasma processing chamber 510, substrate holder 520, upon which a substrate 525 to be processed is affixed, and vacuum pumping system 550. Substrate 525 can be a semiconductor substrate, a wafer, a flat panel display, or a liquid crystal display. Plasma processing chamber 510 can be configured to facilitate the generation of plasma in plasma processing region 545 in the vicinity of a surface of substrate 525. An ionizable gas or mixture of process gases is introduced via a gas distribution system 540. For a given flow of process gas, the process pressure is adjusted using the vacuum pumping system 550. Plasma can be utilized to create materials specific to a predetermined materials process, and/or to aid the removal of material from the exposed surfaces of substrate 525. The plasma processing system 500 can be configured to process substrates of any desired size, such as 200 mm substrates, 300 mm substrates, or larger.

Substrate 525 can be affixed to the substrate holder 520 via a clamping system 528, such as a mechanical clamping system or an electrical clamping system (e.g., an electrostatic clamping system). Furthermore, substrate holder 520 can include a heating system (not shown) or a cooling system (not shown) that is configured to adjust and/or control the temperature of substrate holder 520 and substrate 525. The heating system or cooling system may comprise a re-circulating flow of heat transfer fluid that receives heat from substrate holder 520 and transfers heat to a heat exchanger system (not shown) when cooling, or transfers heat from the heat exchanger system to substrate holder 520 when heating. In other embodiments, heating/cooling elements, such as resistive heating elements, or thermo-electric heaters/coolers can be included in the substrate holder 520, as well as the chamber wall of the plasma processing chamber 510 and any other component within the plasma processing system 500.

Additionally, a heat transfer gas can be delivered to the backside of substrate 525 via a backside gas supply system 526 in order to improve the gas-gap thermal conductance between substrate 525 and substrate holder 520. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 525.

In the embodiment shown in FIG. 5, substrate holder 520 can comprise an electrode 522 through which RF power is coupled to the processing plasma in plasma processing region 545. For example, substrate holder 520 can be electrically biased at a RF voltage via the transmission of RF power from a RF generator 530 through an optional impedance match network 532 to substrate holder 520. The RF electrical bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 100 MHz. RF systems for plasma processing are well known to those skilled in the art.

Furthermore, the electrical bias of electrode 522 at a RF voltage may be pulsed using pulsed bias signal controller 531. The RF power output from the RF generator 530 may be pulsed between an off-state and an on-state, for example.

Alternately, RF power is applied to the substrate holder electrode at multiple frequencies. Furthermore, impedance match network 532 can improve the transfer of RF power to plasma in plasma processing chamber 510 by reducing the reflected power. Match network topologies (e.g. L-type, π-type, T-type, etc.) and automatic control methods are well known to those skilled in the art.

Gas distribution system 540 may comprise a showerhead design for introducing a mixture of process gases. Alternatively, gas distribution system 540 may comprise a multi-zone showerhead design for introducing a mixture of process gases and adjusting the distribution of the mixture of process gases above substrate 525. For example, the multi-zone showerhead design may be configured to adjust the process gas flow or composition to a substantially peripheral region above substrate 525 relative to the amount of process gas flow or composition to a substantially central region above substrate 525.

Vacuum pumping system 550 can include a turbo-molecular vacuum pump (TMP) capable of a pumping speed up to about 5000 liters per second (and greater) and a gate valve for throttling the chamber pressure. In conventional plasma processing devices utilized for dry plasma etching, a 1000 to 3000 liter per second TMP can be employed. TMPs are useful for low pressure processing, typically less than about 50 mTorr. For high pressure processing (i.e., greater than about 100 mTorr), a mechanical booster pump and dry roughing pump can be used. Furthermore, a device for monitoring chamber pressure (not shown) can be coupled to the plasma processing chamber 510.

Controller 555 comprises a microprocessor, memory, and a digital I/O port capable of generating control voltages sufficient to communicate and activate inputs to plasma processing system 500 as well as monitor outputs from plasma processing system 500. Moreover, controller 555 can be coupled to and can exchange information with RF generator 530, pulsed bias signal controller 531, impedance match network 532, the gas distribution system 540, vacuum pumping system 550, as well as the substrate heating/cooling system (not shown), the backside gas supply system 526, and/or the electrostatic clamping system 528. For example, a program stored in the memory can be utilized to activate the inputs to the aforementioned components of plasma processing system 500 according to a process recipe in order to perform a plasma assisted process, such as a plasma etch process, on substrate 525.

Controller 555 can be locally located relative to the plasma processing system 500, or it can be remotely located relative to the plasma processing system 500. For example, controller 555 can exchange data with plasma processing system 500 using a direct connection, an intranet, and/or the internet. Controller 555 can be coupled to an intranet at, for example, a customer site (i.e., a device maker, etc.), or it can be coupled to an intranet at, for example, a vendor site (i.e., an equipment manufacturer). Alternatively or additionally, controller 555 can be coupled to the internet. Furthermore, another computer (i.e., controller, server, etc.) can access controller 555 to exchange data via a direct connection, an intranet, and/or the internet.

In the embodiment shown in FIG. 6, plasma processing system 600 can be similar to the embodiment of FIG. 5 and further comprise either a stationary, or mechanically or electrically rotating magnetic field system 660, in order to potentially increase plasma density and/or improve plasma processing uniformity, in addition to those components described with reference to FIG. 5. Moreover, controller 555 can be coupled to magnetic field system 660 in order to regulate the speed of rotation and field strength. The design and implementation of a rotating magnetic field is well known to those skilled in the art.

Figure 6:
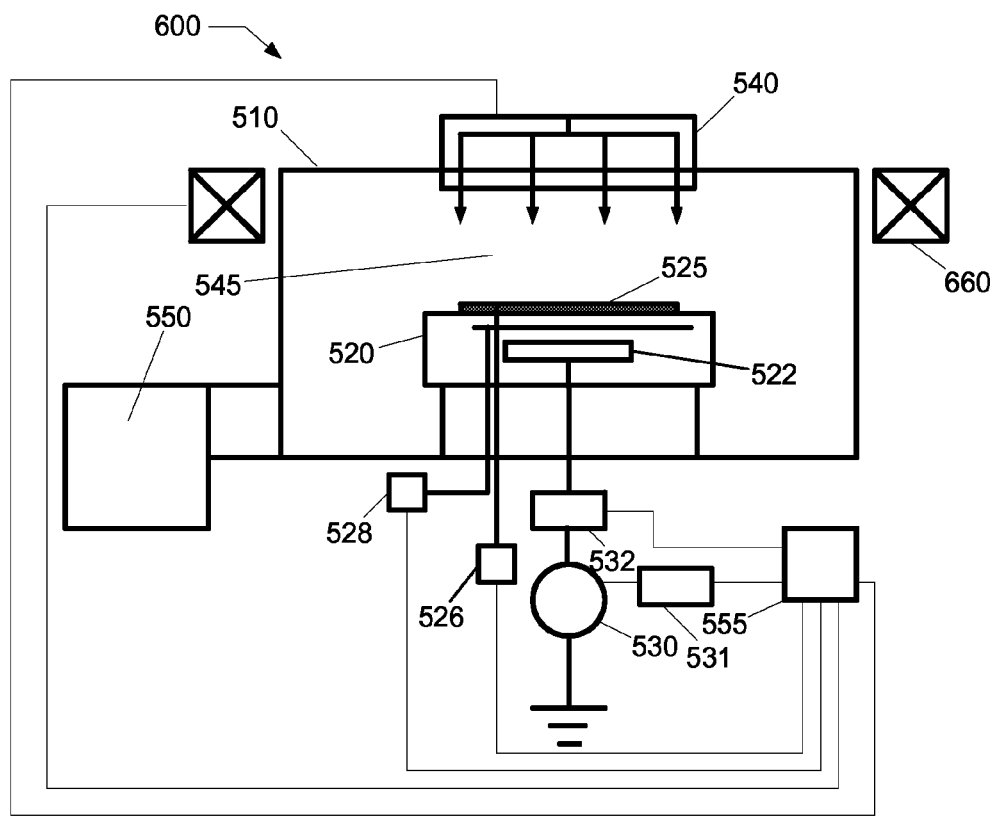
FIG. 6 shows a schematic representation of a plasma processing system according to another embodiment.
Figure 7:
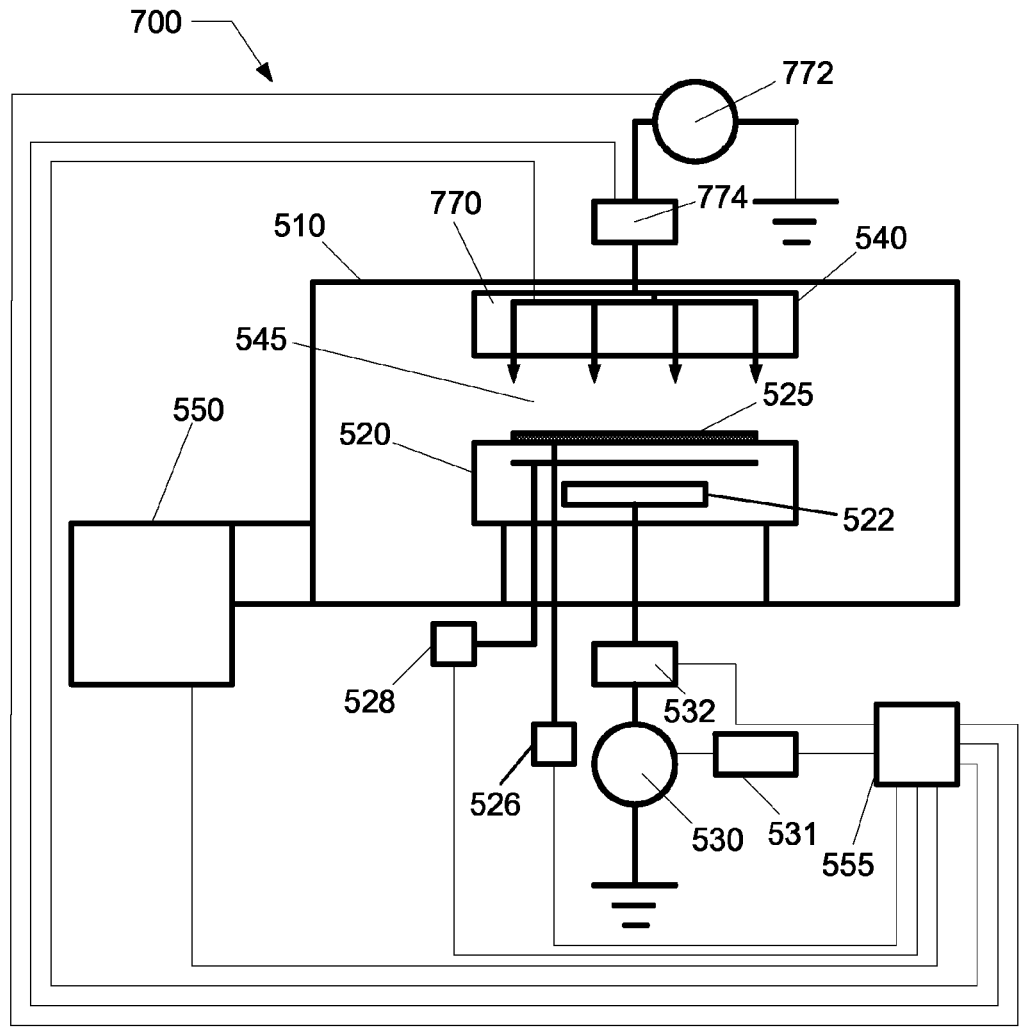
FIG. 7 shows a schematic representation of a plasma processing system according to another embodiment.

In the embodiment shown in FIG. 7, plasma processing system 700 can be similar to the embodiment of FIG. 5 or FIG. 6, and can further comprise an upper electrode 770 to which RF power can be coupled from RF generator 772 through optional impedance match network 774. A frequency for the application of RF power to the upper electrode can range from about 0.1 MHz to about 200 MHz. Additionally, a frequency for the application of power to the lower electrode can range from about 0.1 MHz to about 100 MHz. Moreover, controller 555 is coupled to RF generator 772 and impedance match network 774 in order to control the application of RF power to upper electrode 770. The design and implementation of an upper electrode is well known to those skilled in the art. The upper electrode 770 and the gas distribution system 540 can be designed within the same chamber assembly, as shown. Alternatively, upper electrode 770 may comprise a multi-zone electrode design for adjusting the RF power distribution coupled to plasma above substrate 525. For example, the upper electrode 770 may be segmented into a center electrode and an edge electrode.

Figure 8:
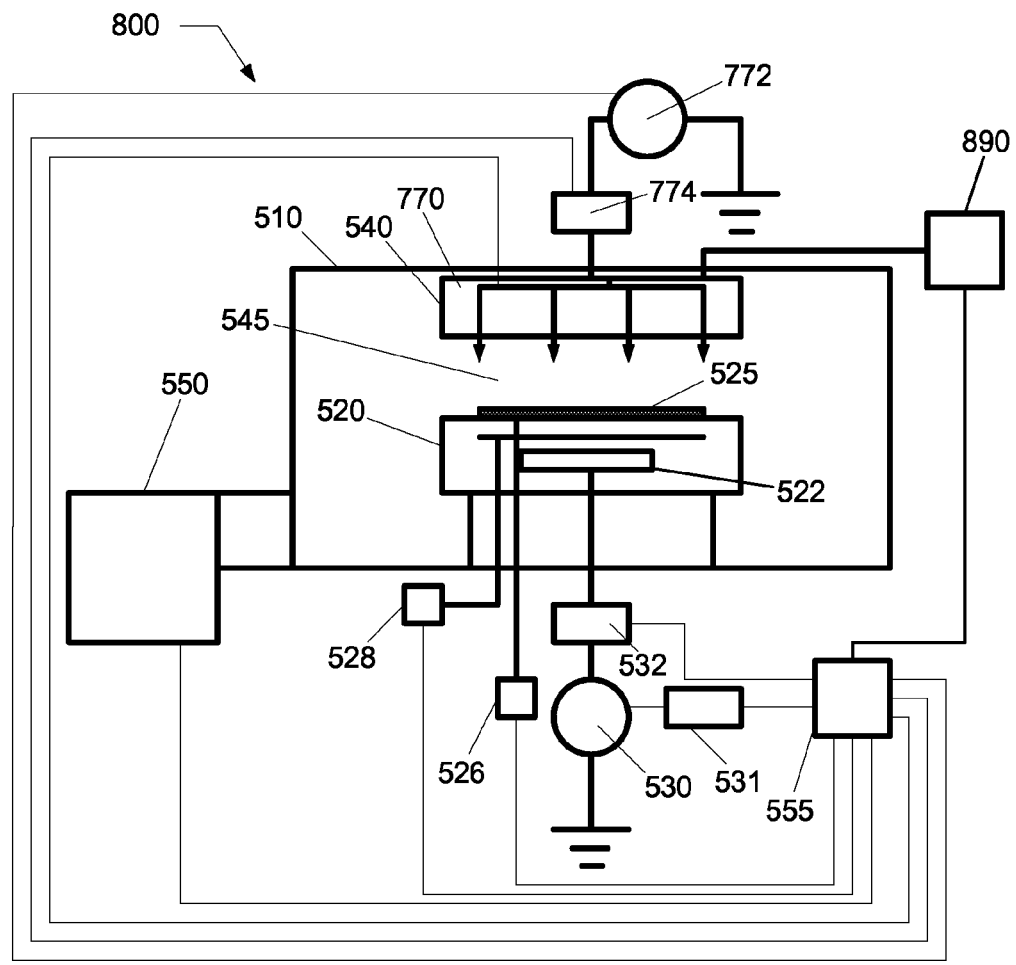
FIG. 8 shows a schematic representation of a plasma processing system according to another embodiment.

In the embodiment shown in FIG. 8, plasma processing system 800 can be similar to the embodiment of FIG. 7, and can further comprise a direct current (DC) power supply 890 coupled to the upper electrode 770 opposing substrate 525. The upper electrode 770 may comprise an electrode plate. The electrode plate may comprise a silicon-containing electrode plate. Moreover, the electrode plate may comprise a doped silicon electrode plate. The DC power supply 890 can include a variable DC power supply. Additionally, the DC power supply 890 can include a bipolar DC power supply. The DC power supply 890 can further include a system configured to perform at least one of monitoring, adjusting, or controlling the polarity, current, voltage, or on/off state of the DC power supply 890. Once plasma is formed, the DC power supply 890 facilitates the formation of a ballistic electron beam. An electrical filter (not shown) may be utilized to de-couple RF power from the DC power supply 890.

For example, the DC voltage applied to upper electrode 770 by DC power supply 890 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the upper electrode 770. The surface of the upper electrode 770 facing the substrate holder 520 may be comprised of a silicon-containing material.

Figure 9:
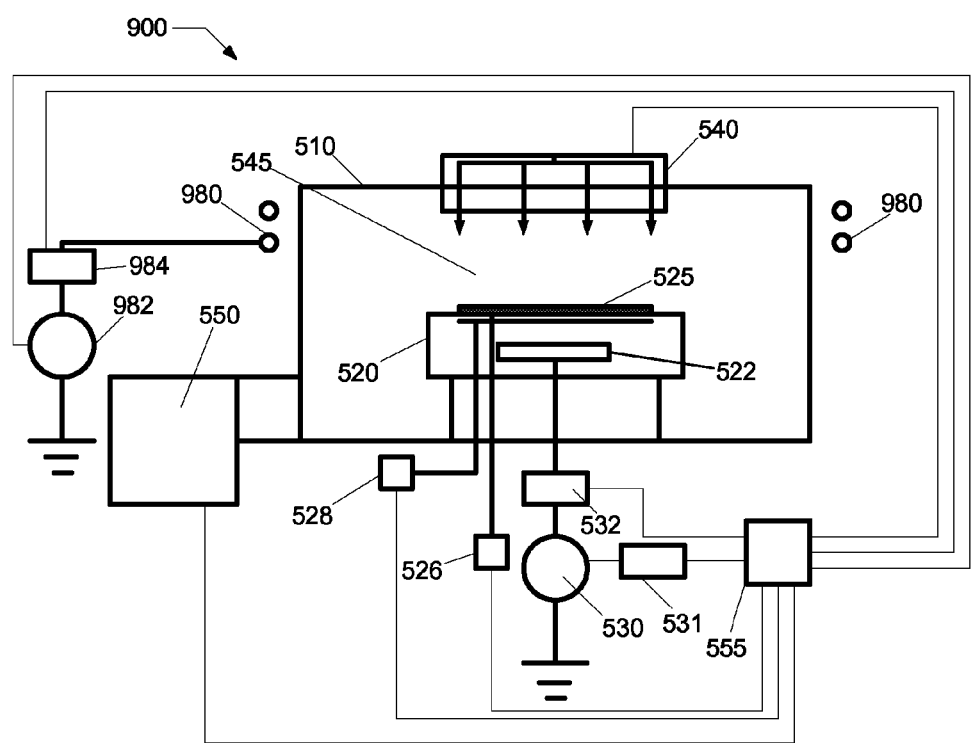
FIG. 9 shows a schematic representation of a plasma processing system according to another embodiment.

In the embodiment shown in FIG. 9, plasma processing system 900 can be similar to the embodiments of FIGS. 5 and 6, and can further comprise an inductive coil 980 to which RF power is coupled via RF generator 982 through optional impedance match network 984. RF power is inductively coupled from inductive coil 980 through a dielectric window (not shown) to plasma processing region 545. A frequency for the application of RF power to the inductive coil 980 can range from about 10 MHz to about 100 MHz. Similarly, a frequency for the application of power to the chuck electrode can range from about 0.1 MHz to about 100 MHz. In addition, a slotted Faraday shield (not shown) can be employed to reduce capacitive coupling between the inductive coil 980 and plasma in the plasma processing region 545. Moreover, controller 555 can be coupled to RF generator 982 and impedance match network 984 in order to control the application of power to inductive coil 980.

Figure 10:
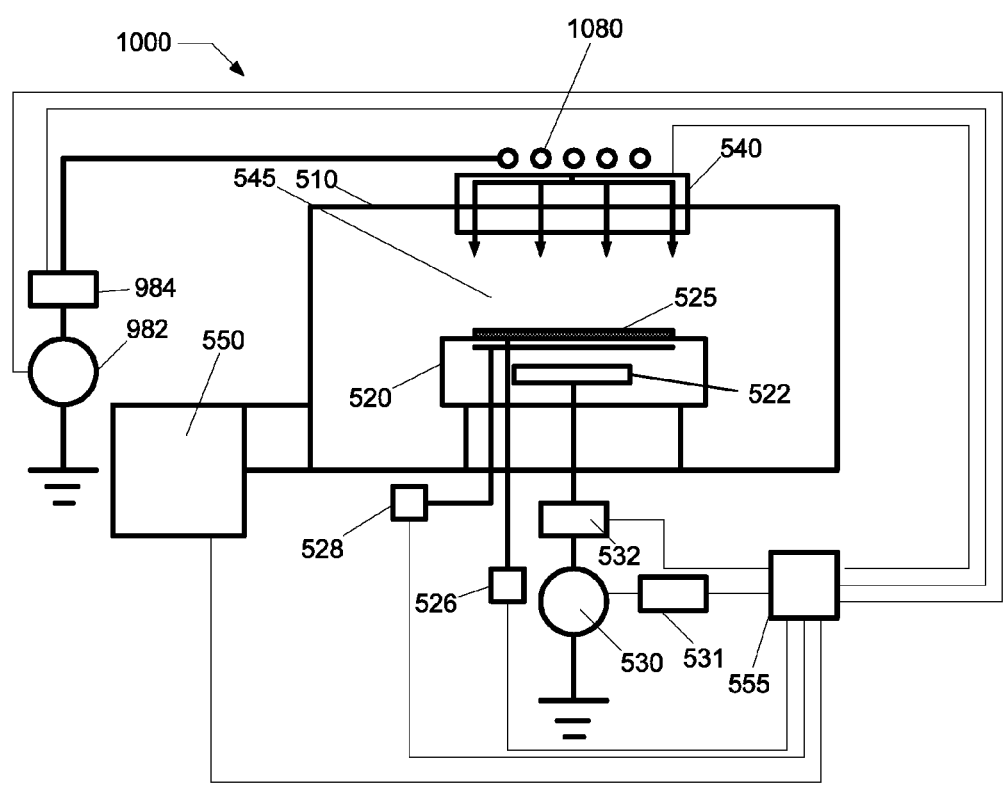
FIG. 10 shows a schematic representation of a plasma processing system according to another embodiment.

In an alternate embodiment, as shown in FIG. 10, plasma processing system 1000 can be similar to the embodiment of FIG. 9, and can further comprise an inductive coil 1080 that is a "spiral" coil or "pancake" coil in communication with the plasma processing region 545 from above as in a transformer coupled plasma (TCP) reactor. The design and implementation of an inductively coupled plasma (ICP) source, or transformer coupled plasma (TCP) source, is well known to those skilled in the art.

Alternately, plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 11:
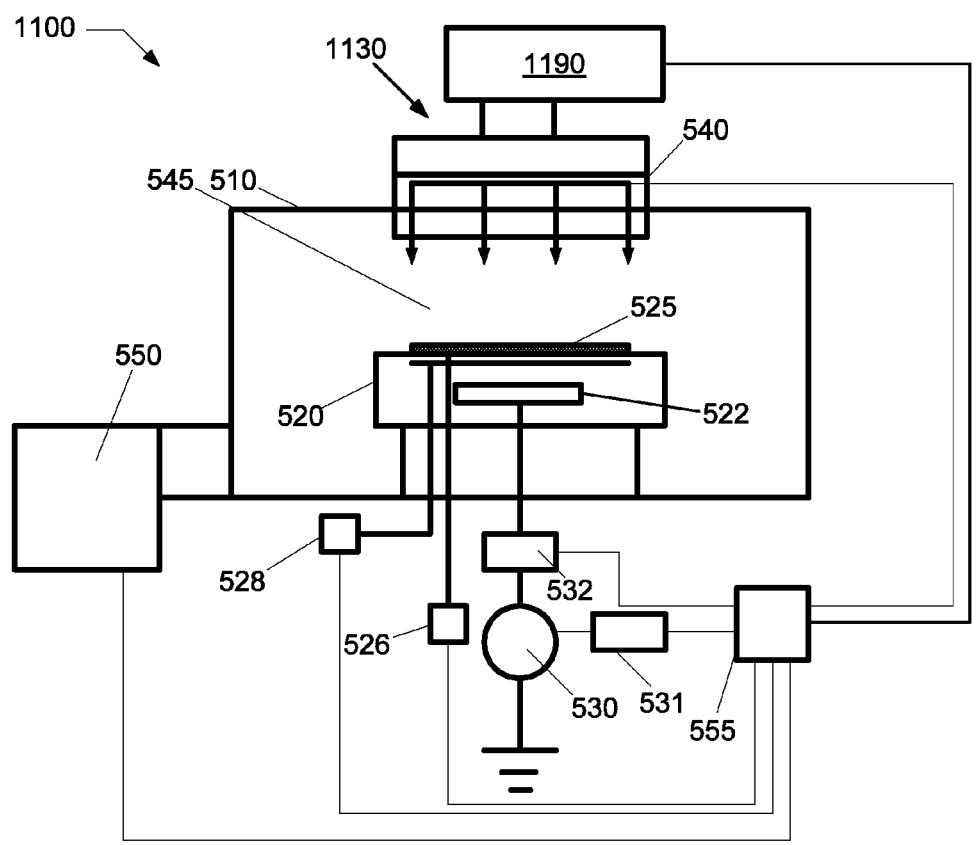
FIG. 11 shows a schematic representation of a plasma processing system according to another embodiment.

In the embodiment shown in FIG. 11, plasma processing system 1100 can be similar to the embodiment of FIG. 5, and can further comprise a surface wave plasma (SWP) source 1130. The SWP source 1130 can comprise a slot antenna, such as a radial line slot antenna (RLSA), to which microwave power is coupled via a power coupling system 1190.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method for removing a hard mask, comprising:
   forming at least a portion of a trench-via structure in a low-k insulation layer on a substrate using one or more etching processes and a hard mask layer overlying said low-k insulation layer;
   depositing a SiOCl-containing layer on exposed surfaces of said trench-via structure to form an insulation protection layer;
   performing one or more etching processes to anisotropically remove at least a portion of said SiOCl-containing layer from at least one surface on said trench-via structure; and
   removing said hard mask layer using a mask removal etching process.

2. The method of claim 1, wherein said depositing said SiOCl-containing layer comprises performing a vapor deposition process in an environment containing Si, Cl, and O.

3. The method of claim 1, wherein said depositing said SiOCl-containing layer comprises performing a plasma-assisted deposition process that includes generating plasma using a process composition containing as incipient ingredients $SiCl_4$ and $O_2$.

4. The method of claim 3, wherein said plasma-assisted deposition process excludes application of a radio frequency (RF) bias to a substrate holder upon which said substrate rests.

5. The method of claim 3, wherein a temperature of said substrate ranges from about 0 degrees C. to about 100 degrees C.

6. The method of claim 3, wherein said depositing said SiOCl-containing layer comprises adjusting at least one process parameter in said plasma-assisted deposition process to increase an etch resistance of said SiOCl-containing layer to said mask removal etching process.

7. The method of claim 1, wherein said depositing said SiOCl-containing layer comprises exposing said substrate to $SiCl_4$ and $H_2O$, and heating said substrate.

8. The method of claim 1, wherein said performing one or more etching processes to anisotropically remove at least a portion of said SiOCl-containing layer comprises using a plasma etching process that includes generating plasma with an etching process composition containing as incipient ingredients a $C_xF_y$-containing gas and a noble gas.

9. The method of claim 8, wherein said plasma etching process comprises applying a radio frequency (RF) bias to a substrate holder upon which said substrate rests.

10. The method of claim 1, wherein said hard mask layer comprises a metal hard mask layer.

11. The method of claim 1, wherein said hard mask layer comprises TiN.

12. The method of claim 1, wherein said mask removal etching process comprises a plasma etching process that includes generating plasma with an etching process composition containing F.

13. The method of claim 1, further comprising:
selectively removing any residual portion of said insulation protection layer from said trench-via structure.

14. The method of claim 13, wherein said selectively removing said residual portion of said insulation protection layer from said trench-via structure comprises performing a wet cleaning process.

15. The method of claim 13, wherein said selectively removing said residual portion of said insulation protection layer from said trench-via structure comprises immersing said residual portion of said insulation protection layer in a dilute aqueous HF solution.

16. The method of claim 1, wherein said forming at least a portion of said trench-via structure in said low-k insulation layer on said substrate comprises:
receiving said substrate having said low-k insulation layer formed thereon, a first hard mask layer overlying said low-k insulation layer, and a second hard mask layer overlying said first hard mask layer;
preparing a first lithographic mask layer with a trench pattern formed therein on said second hard mask layer;
transferring said trench pattern into said second hard mask layer and stopping on said first hard mask layer;
removing said first lithographic mask layer;
preparing a second lithographic mask layer with a via pattern formed therein on said second hard mask layer;
transferring said via pattern through said first hard mask layer and at least partially through said low-k insulation layer;
removing said second lithographic mask layer; and
transferring said trench pattern in said second hard mask layer through said first hard mask layer and into said low-k insulation layer to a pre-determined depth to form a trench-via structure.

17. The method of claim 16, wherein said second hard mask layer contains a metal.

18. The method of claim 16, further comprising:
following said transferring said via pattern and transferring said trench pattern into said second hard mask layer, depositing a provisional SiOCl-containing layer on exposed surfaces of said via pattern within said trench-via structure to form a via insulation protection layer.

19. The method of claim 18, further comprising:
immediately following said depositing said provisional SiOCl-containing layer and preceding said removing said second lithographic mask layer, performing one or more etching processes to anisotropically remove at least a portion of said provisional SiOCl-containing layer from at least one surface on said trench-via structure.

20. The method of claim 16, wherein said transferring said trench pattern comprises:
transferring said trench pattern in said second hard mask layer through said first hard mask layer and into said low-k insulation layer to a first trench depth less than said pre-determined depth;
depositing an intermediate SiOCl-containing layer on exposed surfaces of said trench-via structure to form a first insulation protection layer; and
further transferring said trench pattern into said low-k insulation layer to a second trench depth equal to or less than said pre-determined depth.

\* \* \* \* \*